(12) United States Patent
Yamazaki

(10) Patent No.: US 12,159,888 B2
(45) Date of Patent: Dec. 3, 2024

(54) LIGHT-RECEIVING ELEMENT, SOLID-STATE IMAGING DEVICE, AND RANGING DEVICE

(71) Applicant: SONY SEMICONDUCTOR SOLUTIONS CORPORATION, Kanagawa (JP)

(72) Inventor: Takeshi Yamazaki, Kanagawa (JP)

(73) Assignee: SONY SEMICONDCUTOR SOLUTIONS CORPORATION, Kanagawa (JP)

( * ) Notice: Subject to any disclaimer, the term of this patent is extended or adjusted under 35 U.S.C. 154(b) by 666 days.

(21) Appl. No.: 17/425,407

(22) PCT Filed: Jan. 8, 2020

(86) PCT No.: PCT/JP2020/000354
§ 371 (c)(1),
(2) Date: Jul. 23, 2021

(87) PCT Pub. No.: WO2020/158321
PCT Pub. Date: Aug. 6, 2020

(65) Prior Publication Data
US 2022/0093669 A1    Mar. 24, 2022

(30) Foreign Application Priority Data
Feb. 1, 2019  (JP) ................. 2019-017234

(51) Int. Cl.
*H01L 27/146*  (2006.01)
*G01B 11/22*  (2006.01)
(Continued)

(52) U.S. Cl.
CPC ........ *H01L 27/14623* (2013.01); *G01B 11/22* (2013.01); *G01S 7/4814* (2013.01);
(Continued)

(58) Field of Classification Search
CPC ....... G01B 11/22; G01S 17/10; G01S 17/894; G01S 7/481; G01S 7/4811; G01S 7/4814;
(Continued)

(56) References Cited

U.S. PATENT DOCUMENTS 11,264,424 B2 *  3/2022  Yokogawa ........ H01L 27/14623
11,610,924 B2 *  3/2023  Dofuku ............. H01L 27/14623
(Continued)

FOREIGN PATENT DOCUMENTS

EP    2960952 A1    12/2015
EP    3506355 A1    7/2019
(Continued)

OTHER PUBLICATIONS

International Search Report and Written Opinion of PCT Application No. PCT/JP2020/000354, issued on Mar. 24, 2020, 12 pages of ISRWO.

*Primary Examiner* — John R Lee
(74) *Attorney, Agent, or Firm* — CHIP LAW GROUP

(57) ABSTRACT

There is provided a light-receiving element that includes a semiconductor substrate, a light-shielding film provided on a first surface of the semiconductor substrate and having a lattice form in which openings are arrayed in a matrix form, a plurality of first semiconductor regions arrayed in a matrix form on a second surface opposite to the first surface of the semiconductor substrate, a plurality of second semiconductor regions provided in an adjacent region which is the second surface of the semiconductor substrate and interposes each of the first semiconductor regions in a column direction, and a wiring layer provided on the second surface of the semiconductor substrate and electrically connected to the first semiconductor regions. The first semiconductor region is located in a corresponding region with the light- (Continued)

shielding film and the first surface of the semiconductor substrate interposed therebetween.

13 Claims, 21 Drawing Sheets

(51) Int. Cl.
*G01S 7/10* (2006.01)
*G01S 7/481* (2006.01)
*G01S 7/4865* (2020.01)
*G01S 17/10* (2020.01)
*G01S 17/894* (2020.01)

(52) U.S. Cl.
CPC .......... *G01S 7/4816* (2013.01); *G01S 7/4865* (2013.01); *G01S 17/10* (2013.01); *G01S 17/894* (2020.01); *H01L 27/14607* (2013.01); *H01L 27/1462* (2013.01); *H01L 27/14627* (2013.01); *H01L 27/14636* (2013.01)

(58) Field of Classification Search
CPC .... G01S 7/4816; G01S 7/4865; G01S 7/4868; H01L 27/146; H01L 27/14601; H01L 27/14603; H01L 27/14607; H01L 27/14609; H01L 27/1462; H01L 27/14623; H01L 27/14625; H01L 27/14627; H01L 27/14636
See application file for complete search history.

(56) References Cited

U.S. PATENT DOCUMENTS

| | | | |
|---|---|---|---|
| 11,632,504 B2* | 4/2023 | Sano | H01L 27/14603 348/135 |
| 11,705,473 B2* | 7/2023 | Yokogawa | H01L 27/14629 257/431 |
| 11,817,466 B2* | 11/2023 | Togashi | H01L 31/02325 |
| 2015/0255498 A1* | 9/2015 | Sugiura | H01L 27/14667 257/432 |
| 2016/0035776 A1* | 2/2016 | Saito | H01L 27/14627 257/432 |
| 2017/0194367 A1 | 7/2017 | Fotopoulou et al. | |
| 2018/0026060 A1 | 1/2018 | Suzuki | |
| 2019/0157323 A1* | 5/2019 | Ogi | H01L 27/14689 |
| 2019/0342510 A1 | 11/2019 | Sano | |
| 2021/0091135 A1* | 3/2021 | Yokogawa | H01L 27/14612 |
| 2021/0132199 A1 | 5/2021 | Mase | |
| 2022/0068983 A1* | 3/2022 | Yamazaki | G01B 11/22 |
| 2022/0093669 A1* | 3/2022 | Yamazaki | H01L 27/14636 |
| 2022/0208826 A1* | 6/2022 | Yokogawa | H01L 27/14645 |
| 2022/0337773 A1* | 10/2022 | Takahashi | H01L 27/14609 |
| 2023/0039270 A1* | 2/2023 | Niwa | H04N 25/707 |

FOREIGN PATENT DOCUMENTS

| | | |
|---|---|---|
| EP | 3573104 A1 | 11/2019 |
| EP | 3920242 A1 | 12/2021 |
| JP | 2011-086904 A | 4/2011 |
| JP | 2015207594 A | 11/2015 |
| JP | 2017-522727 A | 8/2017 |
| JP | 2018-117117 A | 7/2018 |
| TW | 201842660 A | 12/2018 |
| WO | 2015/197685 A1 | 12/2015 |
| WO | WO-2017150391 A1 | 9/2017 |
| WO | 2018/042785 A1 | 3/2018 |
| WO | 2018/135320 A1 | 7/2018 |
| WO | WO-2018174090 A1 | 9/2018 |

* cited by examiner

LIGHT-RECEIVING ELEMENT, SOLID-STATE IMAGING DEVICE, AND RANGING DEVICE

CROSS REFERENCE TO RELATED APPLICATIONS

This application is a U.S. National Phase of International Patent Application No. PCT/JP2020/000354 filed on Jan. 8, 2020, which claims priority benefit of Japanese Patent Application No. JP 2019-017234 filed in the Japan Patent Office on Feb. 1, 2019. Each of the above-referenced applications is hereby incorporated herein by reference in its entirety.

TECHNICAL FIELD

The present disclosure relates to a light-receiving element, a solid-state imaging device, and a ranging device.

BACKGROUND ART

In the related art, ranging sensors using an indirect time-of-flight (ToF) scheme are known. In such ranging sensors, distances to objects are measured based on signal charges obtained by emitting light with certain phases from light sources and receiving reflected light of the light.

In such ranging sensors using the indirect ToF scheme (hereinafter referred to as indirect ToF sensors), sensors that can distribute signal charges of reflected light to different regions at a high speed are essential. Accordingly, for example, the following PTL 1 discloses a technology capable of directly applying a voltage to a substrate of a sensor, generating a current in the substrate, and modulating a wide range of a region inside the substrate at a high speed. Such a sensor is also referred to as a current assisted photonic demodulator (CAPD) type of indirect ToF sensor.

CITATION LIST

Patent Literature

[PTL 1]
JP 2011-86904A

SUMMARY

Technical Problem

However, in the CAPD type of indirect ToF sensor according to the technology of the related art, a pixel size is set to be large to improve ranging accuracy. However, since an angle of field is increased due to the large pixel size, there is the problem that a resolution deteriorates.

Accordingly, the present disclosure proposes a light-receiving element, a solid-state imaging device, and a ranging device capable of increasing ranging accuracy while suppressing deterioration in a resolution or increasing the resolution while suppressing nominal cost of the ranging accuracy.

Solution to Problem

To solve the foregoing problem, according to an aspect of the present disclosure, a light-receiving element includes: a semiconductor substrate; a light-shielding film provided on a first surface of the semiconductor substrate and having a lattice form in which openings are arrayed in a matrix form; a plurality of first semiconductor regions arrayed in a matrix form on a second surface opposite to the first surface of the semiconductor substrate; a plurality of second semiconductor regions provided in an adjacent region which is the second surface of the semiconductor substrate and interposes each of the first semiconductor regions in a column direction; and a wiring layer provided on the second surface of the semiconductor substrate and electrically connected to the first semiconductor regions. The first semiconductor region is located in a corresponding region with the light-shielding film and the first surface of the semiconductor substrate interposed therebetween. The wiring layer includes a main wiring extending in the column direction in the corresponding regions with the light-shielding film and the first surface of the semiconductor substrate interposed therebetween and a branch wiring extending in a row direction in the corresponding regions with the light-shielding film and the first surface of the semiconductor substrate interposed therebetween and connecting the main wiring to each of the first semiconductor regions.

DESCRIPTION OF EMBODIMENTS

Figure 1:
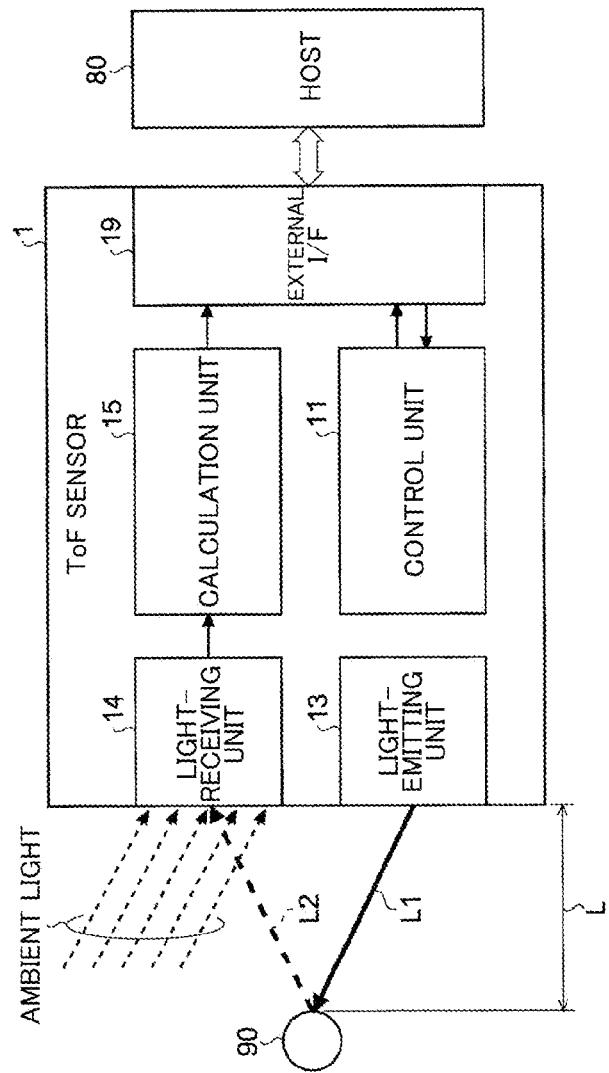
FIG. 1 is a block diagram illustrating an overall configuration example of a ToF sensor serving as a ranging device according to a first embodiment.

Hereinafter, an embodiment of the present disclosure will be described with reference to the drawings. In the following embodiments, the same reference numerals are given to the same portions and repeated description thereof will omitted.

The present disclosure will be described in the following item order.

1. First embodiment
1.1 Ranging device (ToF sensor)
1.2 Configuration example of solid-state imaging device
1.3 Configuration example of circuit of unit pixel
1.4 Planar layout example of light-receiving element
1.4.1 Planar layout example according to comparative example
1.4.2 Planar layout example according to first embodiment
1.5 Chip configuration example
1.6 Cross-sectional structure example of unit pixel
1.7 Positional relation between PN semiconductor region and light-shielding film
1.8 Reading operation example of unit pixel
1.9 Layout example of MIX wiring
1.9.1 MIX wiring according to comparative example
1.9.2 MIX wiring according to first embodiment
1.10 Driving example upon reading pixel signal
1.10.1 First driving example
1.10.1.1 MIX wiring in first driving example
1.10.2 Second driving example
1.10.2.1 MIX wiring in second driving example
1.11 Electric field in semiconductor substrate
1.12 Relation between operation speed and contrast
1.13 Relation between operation voltage and contrast
1.14 Operational effects
2. Second embodiment
2.1 Planar layout example according to second embodiment
2.2 Driving examples upon reading pixel signals
2.3 Operational effects
3. Third embodiment
4. Fourth embodiment
5. Application examples 1. First Embodiment First, a first embodiment will be described in detail below with reference to the drawings. In the first embodiment, for example, a light-receiving element that measures a distance to an object in accordance with an indirect ToF scheme, a solid-state imaging device, and a ranging device will be described as an example.

A light-receiving element, a solid-state imaging device, and a ranging device according to the embodiment can be applied to, for example, an in-vehicle system that is mounted in a vehicle and measures a distance to a target object outside of the vehicle, a gesture recognition system that measures a distance to a target such as a hand of a user and recognizes a gesture of a user based on the measurement result, or the like. In this case, a result of the gesture recognition can also be applied to, for example, an operation or the like of a car navigation system.

1.1 Ranging Device (ToF Sensor)

FIG. 1 is a block diagram illustrating an overall configuration example of a ToF sensor serving as a ranging device according to the embodiment. As illustrated in FIG. 1, a ToF sensor 1 includes a control unit 11, a light-emitting unit 13, a light-receiving unit 14, a calculation unit 15, and an external interface (I/F) 19.

The control unit 11 is configured as, for example, an information processing device such as a central processing unit (CPU) and controls each unit of the ToF sensor 1.

The external I/F 19 may be, for example, a communication adapter that establishes communication with an external host 80 via a communication network in conformity with any standard such as not only a wireless local area network (LAN) or a wired LAN but also a controller area network (CAN), a local interconnect network (LIN), or FlexRay (registered trademark).

Here, for example, when the ToF sensor 1 is mounted in an automobile or the like, the host 80 may be an engine control unit (ECU) mounted in the automobile or the like. When the ToF sensor 1 mounted in an autonomous moving robot such as a robot pet at home or an autonomous moving body such as robot cleaner, an unmanned aircraft, or follow-up conveyance robot, the host 80 may be a control device or the like that controls the autonomous moving body.

The light-emitting unit 13 includes, for example, a single semiconductor laser diode or a plurality of semiconductor laser diodes as a light source and emits pulsed laser light L1 with a predetermined time width at a predetermined period (also referred to as a light-emitting period). The light-emitting unit 13 emits the laser light L1 toward at least an angle range equal to or greater than an angle of field of the light-receiving unit 14. The light-emitting unit 13 emits, for example, the laser light L1 with a time width of 10 nanoseconds (ns) at a period of 100 megahertz (MHz). For example, when there is an object 90 within the ranging range, the laser light L1 emitted from the light-emitting unit 13 is reflected from the object 90 and is incident as reflected light L2 on the light-receiving unit 14.

As will be described in details, the light-receiving unit 14 includes, for example, a plurality of pixels arrayed in a 2-dimensional lattice form and outputs a signal intensity (hereinafter also referred to as a pixel signal) detected at each pixel after the light-emitting unit 13 emits the light.

The calculation unit 15 generates a depth image within the angle of field of the light-receiving unit 14 based on the pixel signal output from the light-receiving unit 14. At this time, the calculation unit 15 may perform a predetermined process such as noise removal on the generated depth image. The depth image generated by the calculation unit 15 can be output to the host 80 or the like via, for example, the external I/F 19.

1.2 Configuration Example of Solid-State Imaging Device

Figure 2:
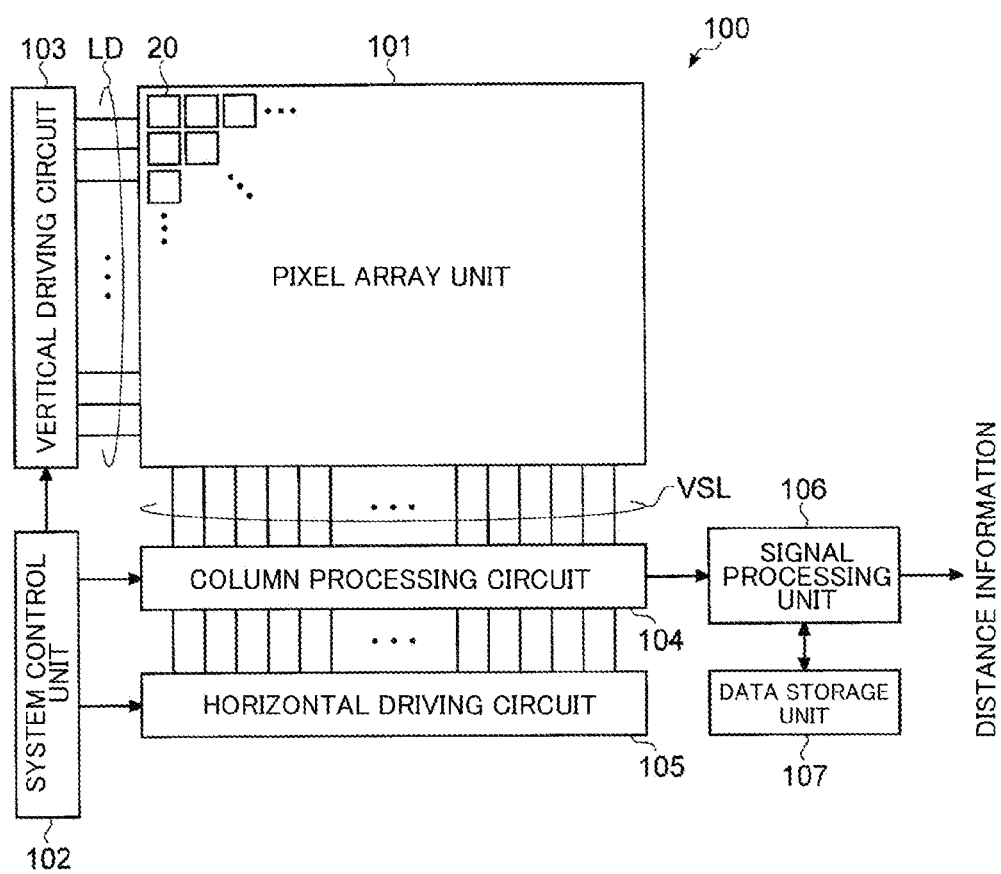
FIG. 2 is a block diagram illustrating an overall configuration example of a solid-state imaging device serving as a light-receiving unit according to the first embodiment.

FIG. 2 is a block diagram illustrating an overall configuration example of a solid-state imaging device serving as a light-receiving unit according to the first embodiment.

A solid-state imaging device 100 illustrated in FIG. 2 is a backside irradiation CAPD type indirect ToF sensor (hereinafter simply referred to as a CAPD sensor) and is provided in a ranging device that has a ranging function.

The solid-state imaging device 100 includes a pixel array unit 101 and peripheral circuits. The peripheral circuits can include, for example, a vertical driving circuit 103, a column processing circuit 104, a horizontal driving circuit 105, and a system control unit 102.

The solid-state imaging device 100 can further include a signal processing unit 106 and a data storage unit 107. The signal processing unit 106 and the data storage unit 107 may be mounted on the same substrate as the solid-state imaging device 100 or may be disposed in a different substrate from the solid-state imaging device 100 in the ranging device.

The pixel array unit 101 generates charges in accordance with an amount of received light and has a configuration in which pixels (hereinafter referred to as unit pixels) 20 outputting signals in accordance with the charges are arrayed in a row direction and a column direction, that is, a 2-dimensional lattice form. That is, the pixel array unit 101 includes a plurality of unit pixels 20 that photoelectrically convert incident light and output signals in accordance with charge obtained as a result.

Here, the row direction is an arrangement direction (in the drawing, the horizontal direction) of the unit pixels 20 in the pixel rows and the column direction is an arrangement direction (in the drawing, the vertical direction) of the unit pixels 20 in the pixel columns.

In the pixel array unit 101, a pixel driving line LD is wired in the row direction for each pixel row and two vertical signal lines VSL are wired in the column direction for each pixel column in the pixel array of the matrix form. For example, the pixel driving line LD transmits a driving signal for driving when a signal is read from the unit pixel 20. In FIG. 2, one wiring is illustrated for the pixel driving LD, but the present disclosure is not limited to one wiring. One end of the pixel driving signal LD is connected to an output end corresponding to each row of the vertical driving circuit 103.

The vertical driving circuit 103 is configured as a shift register, an address decoder, or the like and drives the unit pixels 20 of the pixel array unit 101 in units of all the pixels, units of rows, or the like. That is, the vertical driving circuit 103 configures a driving unit that controls an operation of each unit pixel 20 of the pixel array unit 101 along with the system control unit 102 controlling the vertical driving circuit 103.

In ranging of the indirect ToF scheme, the number of elements (CAPD elements) that are connected to one control line and perform high-speed driving affects controllability of the high-speed driving and the accuracy of driving. Many solid-state image sensors used for ranging in an indirect ToF scheme are conceivable for a pixel array that is longer in the horizontal direction. Accordingly, in this case, the vertical signal line VSL or a another vertically long control line may be used as the control line of an element that performs high-speed driving. In this case, for example, the plurality of unit pixels 20 arrayed in the vertical direction are connected to the vertical signal line VSL or the other control line long in the vertical direction, and driving of the unit pixels 20 by a driving unit provided separately from the vertical driving circuit 103, the horizontal driving circuit 105, or the like, that is, driving of the solid-state imaging device 100, is performed via the vertical signal line VSL or the other control line.

A signal output from each unit pixel 20 in the pixel row under driving control of the vertical driving circuit 103 is input to the column processing circuit 104 via the vertical signal line VSL. The column processing circuit 104 performs predetermined signal processing on the signal output from each unit pixel 20 via the vertical signal line VSL and temporarily retains a pixel signal after the signal processing.

Specifically, the column processing circuit 104 performs a noise removing process, an analog-to-digital (AD) conversion process, or the like as the signal processing.

The horizontal driving circuit 105 is configured as a shift register, an address decoder, or the like and sequentially selects the unit circuit corresponding to the pixel column of the column processing circuit 104. Through selective scanning of the horizontal driving circuit 105, pixel signals subjected to the signal processing for each unit circuit in the column processing circuit 104 are sequentially output.

The system control unit 102 is configured as a timing generator or the like that generates various timing signals and performs driving control on the vertical driving circuit 103, the column processing circuit 104, the horizontal driving circuit 105, and the like based on the various timing signals generated by the timing generator.

The signal processing unit 106 has at least a calculation processing function, performs various kinds of signal processing such as a calculation process based on the pixel signals output from the column processing circuit 104, and outputs distance information of each pixel calculated through that process to the outside. The data storage unit 107 temporarily stores data necessary for signal processing per signal processing of the signal processing unit 106.

1.3 Configuration Example of Circuit of Unit Pixel

Figure 3:
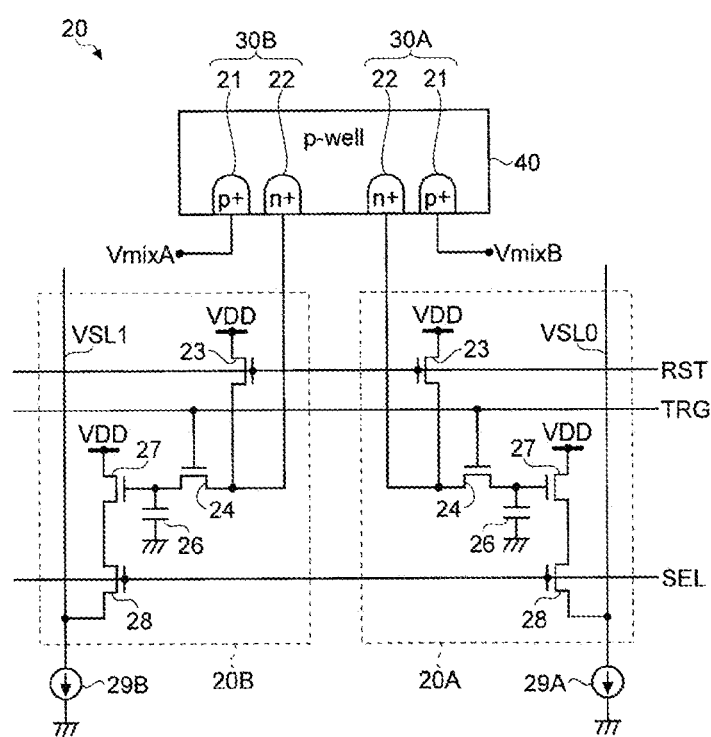
FIG. 3 is a circuit diagram illustrating an example of an equivalent circuit of a unit pixel according to the first embodiment.

FIG. 3 is a circuit diagram illustrating an example of an equivalent circuit of a unit pixel according to the embodiment. As illustrated in FIG. 3, the unit pixel 20 has a configuration in which a charge reading voltage (hereinafter referred to as a reading voltage) VmixA is applied to a p+ semiconductor region (hereinafter referred to as MIX) 21 in one signal extraction unit 30A between two signal extraction units 30A and 30B formed in the semiconductor substrate 40, and a reading circuit 20A including a transfer transistor 24, an FD 26, a reset transistor 23, an amplification transistor 27, and a selection transistor 28 is connected to an n+ semiconductor region (hereinafter referred to as a DET) 22.

Similarly, the unit pixel 20 has a configuration in which a reading voltage VmixB is applied to a MIX 21 in the other signal extraction unit 30B and a reading circuit 20B including a transfer transistor 24, an FD 26, a reset transistor 23, an amplification transistor 27, and a selection transistor 28 is connected to the DET 22.

A region partitioned into two signal extraction units 30A and 30B in the semiconductor substrate 40 functions as a light-receiving element of each unit pixel 20.

The vertical driving circuit 103 applies the reading voltage VmixA to the MIX 21 of the signal extraction unit 30A and applies the reading voltage VmixB to the MIX 21 of the signal extraction unit 30B. For example, when a signal (charge) is extracted from the signal extraction unit 30A, the vertical driving circuit 103 applies the reading voltage VmixA of 1.5 V (volts) to the MIX 21 of the signal extraction unit 30A and applies the reading voltage VmixB of 0 V to the MIX 21 of the signal extraction unit 30B. On the other hand, when a signal (charge) is extracted from the signal extraction unit 30B, the vertical driving circuit 103 applies the reading voltage VmixB of 1.5 V (volts) to the MIX 21 of the signal extraction unit 30B and applies the reading voltage VmixA of 0 V to the MIX 21 of the signal extraction unit 30A.

The DET 22 in each of the signal extraction units 30A and 30B is a charge detection unit that detects the charges generated by photoelectrically converting the light incident on the semiconductor substrate 40 and accumulates the charges.

The transfer transistor 24 in each of the reading circuits 20A and 20B transfers the charges accumulated in the respective corresponding DET 22 to the FD 26 when a driving signal TRG supplied from the vertical driving circuit 103 to a gate enters an active state and a conductive state in response thereto.

The FD 26 has a charge voltage conversion function of generating a voltage of a voltage value in accordance with the accumulated charges and applies the voltage of the voltage value in accordance with the charge amount to the gate of the amplification transistor 27 by temporarily retaining the charges transferred from the DET 22.

The reset transistor 23 resets a potential of the FD 26 to a predetermined level (a reset level VDD) when the driving signal RST supplied from the vertical driving circuit 103 to the gate enters an active state and a conductive state in response thereto. When the reset transistor 23 enters the active state, the transfer transistor 24 also enters the active state so that the charges accumulated in the DET 22 can be reset as well.

The amplification transistor 27 has a source connected to a vertical signal VSL0/VSL1 via the selection transistor 28 and configures a source follower circuit along with a load MOS transistor of a constant current circuit 29A/29B connected to one end of the vertical signal VSL0/VSL1.

The selection transistor 28 is connected between the source of the amplification transistor 27 and the vertical signal line VSL0/VSL1. The selection transistor 28 outputs a pixel signal output from the amplification transistor 27 to the vertical signal line VSL0/VSL1 when the selection signal SEL supplied from the vertical driving circuit 103 to the gate enters an active state and a conductive state in response thereto

1.4 Planar Layout Example of Light-Receiving Element

Next, a planar layout example of the light-receiving element in the pixel array unit 101 will be described in detail according to a comparative example.

1.4.1 Planar Layout Example According to Comparative Example

Figure 4:
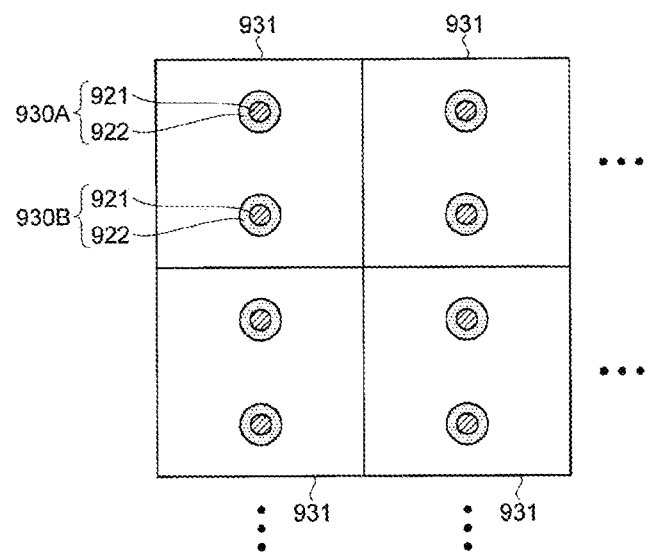
FIG. 4 is a plan view illustrating a layout example of the light-receiving element according to a comparative example.
Figure 5:
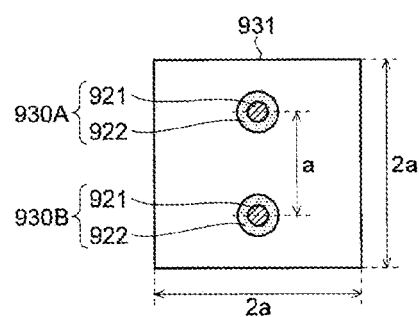
FIG. 5 is a plan view illustrating an example of the size of the light-receiving element illustrated in FIG. 4.

FIG. 4 is a plan view illustrating a layout example of the light-receiving element according to a comparative example. FIG. 5 is a plan view illustrating an example of the size of the light-receiving element illustrated in FIG. 4.

As illustrated in FIG. 4, the pixel array unit according to the comparative example has a configuration in which a plurality of light-receiving elements 931 are arrayed in a 2-dimensional lattice form. Near the center of each light-receiving element 931, for example, two signal extraction units 930A and 930B disposed separately in the column direction are included. Each of the signal extraction units 930A and 930B includes, for example, a MIX 921 that has a circular cross-section along an array surface of the light-receiving element 931 and a DET 922 that is provided to surround the circumference of the MIX 921.

Here, as illustrated in FIG. 5, when a is a distance between the centers of the signal extraction units 930A and 930B in each light-receiving element 931, each light-receiving element 931 is provided in, for example, a rectangular region of which a length in the column direction is 2a. In FIG. 5, the region of the light-receiving element 931 of which the length in the row direction is 2a has a square, but the present disclosure is not limited to the square and various modifications can be made.

1.4.2 Planar Layout Example According to First Embodiment

Figure 6:
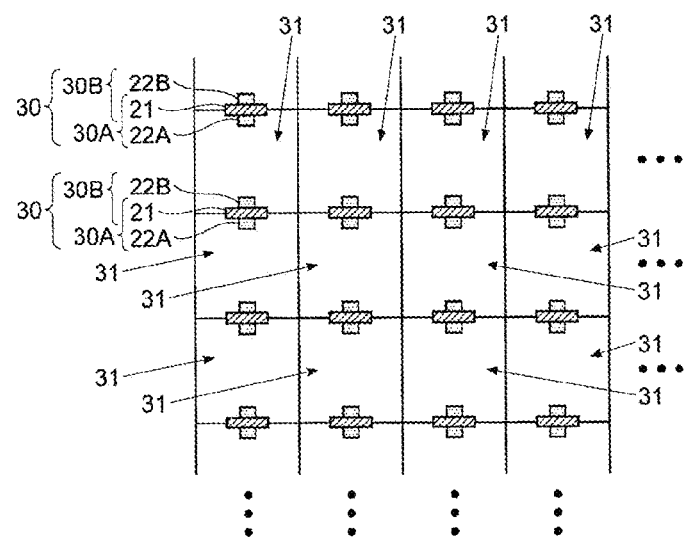
FIG. 6 is a plan view illustrating a layout example of the light-receiving element according to the first embodiment.
Figure 7:
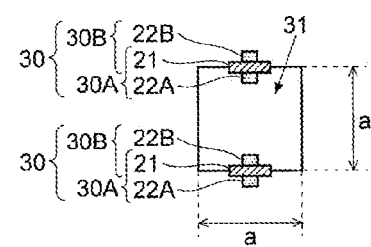
FIG. 7 is a plan view illustrating an example of the size of the light-receiving element illustrated in FIG. 6.

On the other hand, FIG. 6 is a plan view illustrating a layout example of the light-receiving element according to the embodiment. FIG. 7 is a plan view illustrating an example of the size of the light-receiving element illustrated in FIG. 6.

As illustrated in FIG. 6, a pixel array unit 101 according to the embodiment has a configuration in which a plurality of light-receiving elements 31 are arrayed in 2-dimensional lattice form. A PN semiconductor region 30 is provided in each boundary of the light-receiving elements 31 in the column direction (in the drawing, the vertical direction).

Each PN semiconductor region 30 includes, for example, the MIX 21 located at each boundary of the light-receiving element 31, a DET 22A adjacent to the MIX 21 from the lower side in the column direction, and a DET 22B adjacent to the MIX 21 from the upper side in the column direction. The lengths of the DET 22A and the DET 22B in the row direction with respect to the MIX 21 may be shorter than, for example, the length of the MIX 21 in the row direction. In this case, since an electric field formed by two MIXs 21 in the light-receiving element 31 can reduce an influence of the DET 22A and the DET 22B, the charges can be efficiently collected in the DET 22A or the DET 22B. Thus, it is possible to suppress a decrease in quantum efficiency.

In such a configuration, the MIX 21 and the DET 22A in each PN semiconductor region 30 configure the signal extraction unit 30A of the lower light-receiving element 31 between two light-receiving elements 31 forming each boundary, and the MIX 21 and the DET 22B configure the signal extraction unit 30B of the upper light-receiving element 31. That is, the MIX 21 located at the boundary of two light-receiving elements 31 share the two light-receiving elements 31.

Here, as in the light-receiving element 931 exemplified in FIG. 5, when a is a distance between the centers of the MIXs 21 of the signal extraction units 30A and 30B, each light-receiving element 31 can be set as a rectangular region of which a length in the column direction is a, as illustrated in FIG. 7. That is, in the configuration in which the MIX 21 is shared by two adjacent vertically light-receiving elements 31 as in the embodiment, the distance between the centers of the MIXs 21 can be set as a pixel pitch of the light-receiving element 31 as it is. Thus, since integration of the light-receiving elements 31 in the column direction can be increased, it is possible to improve a resolution in the column direction.

For example, in comparison to the comparative example illustrated in FIG. 4 or 5, the length of each light-receiving element 31 in the column direction can be halved. Thus, for example, in comparison to the comparative example illustrated in FIG. 4 or 5, the resolution in the column direction can be doubled. At this time, for example, by setting a planar region of the light-receiving element 31 to a square, the resolution in the row direction can also be doubled.

1.5 Chip Configuration Example

Figure 8:
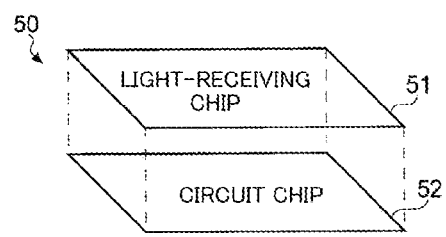
FIG. 8 is a diagram illustrating a chip configuration example of a solid-state imaging device according to the first embodiment.

FIG. 8 is a diagram illustrating a chip configuration example of a solid-state imaging device according to the embodiment. As illustrated in FIG. 8, the solid-state imaging device 100 has, for example, a structure of a laminated chip 50 in which a light-receiving chip 51 and a circuit chip 52 are vertically laminated. The light-receiving chip 51 is, for example, a semiconductor chip configured from a semiconductor substrate 40 that functions as a light-receiving element in the unit pixel 20. The circuit chip 52 is, for example, a semiconductor chip in which the reading circuits 20A and 20B in the unit pixel 20, peripheral circuits, and the like are formed.

In bonding of the light-receiving chip 51 and the circuit chip 52, for example, so-called direct bonding in which bonding surfaces are flattened and both chips are bonded by an inter-electronic force can be used. Here, the present disclosure is not limited thereto. For example, so-called Cu—Cu bonding in which electronic pads made of cupper (Cu) formed on bonding surfaces are mutually bonded, bump bonding, or the like can also be used.

The light-receiving chip 51 and the circuit chip 52 are, for example, electrically connected with a connection unit such as a through-silicon via (TSV) penetrating through the semiconductor substrate interposed therebetween. In the connection in which the TSV is used, for example, a so-called twin TSV scheme of connecting two TSVs, a TSV provided in the light-receiving chip 51 and a TSV provided through the light-receiving chip 51 and the circuit chip 52, on external surfaces of the chips or a so-called shared TSV scheme of connecting both the chips by a TSV penetrating from the light-receiving chip 51 to the circuit chip 52 can be adopted.

Here, when Cu—Cu bonding or bump connection is used to bond the light-receiving chip 51 and the circuit chip 52, both the chips are electrically connected with a Cu—Cu bonding portion or a dump bonding portion interposed therebetween.

Figure 16:
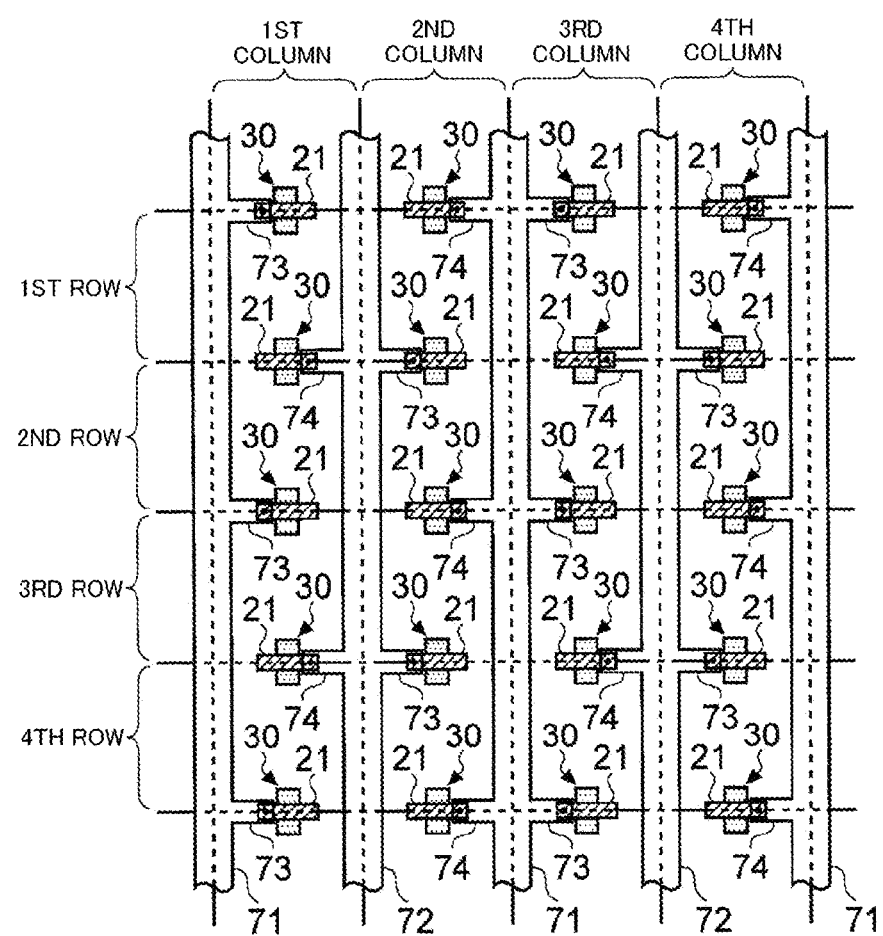
FIG. 16 is a plan view illustrating a layout example of the MIX wiring to realize the first driving example according to the first embodiment.

The laminated chip 50 illustrated in FIG. 16 may include the calculation unit 15, the light-emitting unit 13, or the control unit 11 besides the solid-state imaging device 100.

1.6 Cross-Sectional Structure Example of Unit Pixel

Figure 9:
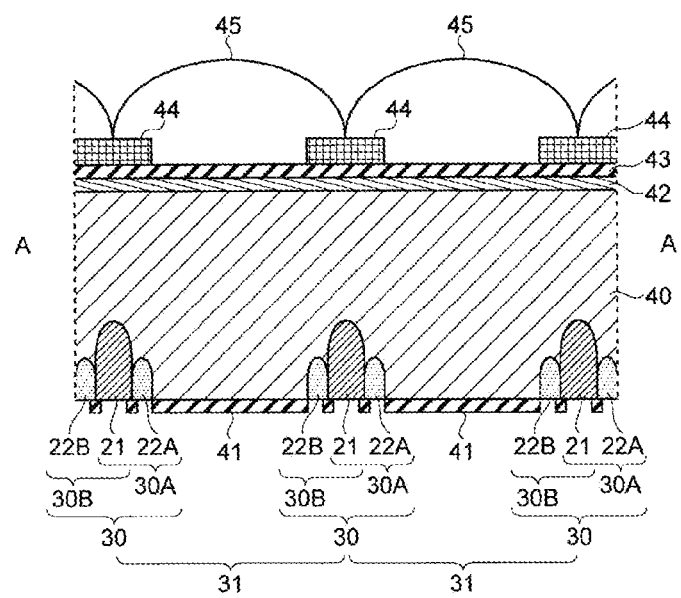
FIG. 9 is a cross-sectional view illustrating an overall configuration example of the light-receiving element according to the first embodiment.

FIG. 9 is a cross-sectional view illustrating an overall configuration example of the light-receiving element according to the embodiment. FIG. 9 illustrates a cross-sectional structure example of a portion of the light-receiving chips 51 of two light-receiving elements 31 adjacent in the column direction in the so-called backside irradiation type solid-state imaging device 100.

As illustrated in FIG. 9, the light-receiving element 31 in each unit pixel 20 includes, for example, a semiconductor substrate 40 such as a silicon substrate that has a p-type well (p-well), an anti-reflection film 42 provided on the rear surface side (in the drawing, the upper surface side) of the semiconductor substrate 40, a flattened film 43 provided on the anti-reflection film 42, and an on-chip lens 45 provided on the flattened film 43. The circuit chip 52 may be laminated on the front surface side (in the drawing, the lower surface side) of the semiconductor substrate 40 with an insulation film 41 or the like such as a silicon oxide film.

In the semiconductor substrate 40, for example, a semiconductor substrate such as a silicon substrate can be used and a substrate thickness is a thin thickness equal to or less than 20 μm (micrometers), for example. The thickness of the semiconductor substrate 40 may be equal to or greater than 20 μm and the thickness may be appropriately determined in accordance with a target property or the like of the solid-state imaging device 100.

The anti-reflection film 42 may be, for example, a film formed of a high refractive index material such as a silicon oxide nitride (SiON). The flattened film 43 may be, for example, a film formed of an insulation material such as a silicon oxide ($SiO_2$).

At a boundary between the adjacent light-receiving elements 31 on the flattened film 43, a light-shielding film 44 is provided to prevent mixed color between adjacent pixels. For example, a material such as tungsten (W) that has a light-shielding property may be used for the light-shielding film 44.

In a region on the front surface side (in the drawing, the lower surface side) in the semiconductor substrate 40, a PN semiconductor region 30 including the signal extraction units 30A and 30B is provided.

Here, the MIX 21 in each of the signal extraction units 30A and 30B may be, for example, a region in which acceptors such as boron (B) diffuse to the semiconductor substrate 40, and the DET 22A and the DET 22B may be a region in which donors such as phosphorus (P) or arsenic (As) diffuse to the semiconductor substrate 40.

The DET 22A of the signal extraction unit 30A and the DET 22B of the signal extraction unit 30B function as a charge detection unit that detects an amount of light incident on the light-receiving element 31 from the outside, that is, an amount of charge generated through photoelectric conversion by the semiconductor substrate 40.

On the other hand, the MIX 21 functions as a voltage application unit that inject many carrier currents to the semiconductor substrate 40, that is, directly applies a voltage to the semiconductor substrate 40 to generate an electric field inside the semiconductor substrate 40.

In the embodiment, for example, the FD 26 is directly connected to each of the DET 22A and the DET 22B (see FIG. 3).

In the on-chip lens 45, for example, a silicon oxide (SiO$_2$) or a transparent resin can be used. A curvature of the on-chip lens 45 is set so that the incident light is condensed near the center of the light-receiving element 31.

Figure 10:
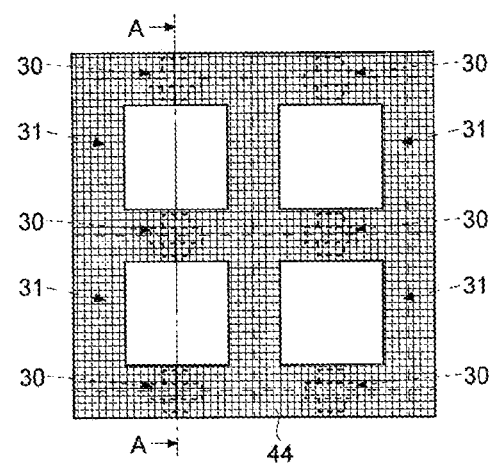
FIG. 10 is a top view illustrating a positional relation between a PN semiconductor region and a light-shielding film in FIG. 9 when viewed in a direction perpendicular to a light incidence surface in a semiconductor substrate.

1.7 Positional Relation Between PN Semiconductor Region and Light-Shielding Film FIG. 10 is a top view illustrating a positional relation between the PN semiconductor region and the light-shielding film in FIG. 9 when viewed in a direction perpendicular to a light incidence surface in the semiconductor substrate.

In the structure illustrated in FIG. 9, the light-shielding films 44 are provided in a lattice form along the boundaries of the plurality of light-receiving elements 31 arrayed in the 2-dimensional lattice form, for example, as illustrated in FIG. 10. In this case, openings in which the light-shielding films 44 are formed are arrayed in a 2-dimensional lattice form.

The PN semiconductor region 30 is formed in, for example, a region overlapping a portion extending in the row direction in the light-shielding film 44 when viewed in a direction perpendicular to a light incidence surface in the semiconductor substrate 40, as illustrated in FIG. 10. In this case, the PN semiconductor regions 30 are arrayed in a 2-dimensional lattice form.

Figure 11:
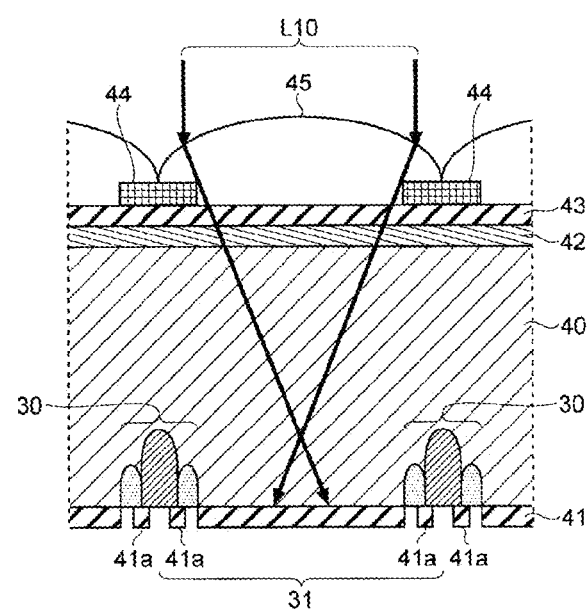
FIG. 11 is a diagram illustrating incidence of light on the light-receiving element according to the first embodiment.

In this way, by disposing the PN semiconductor regions 30 in a region optically overlapping the light-shielding films 44, as exemplified in FIG. 11, it is possible to reduce incidence of incident light L10 on portions 41a electrically separating the MIX 21 of the PN semiconductor region 30 from the DET 22A and the DET 22B in the insulation film 41 formed on the front surface side (in the drawing, the lower surface side) of the semiconductor substrate 40. Thus, since irregular reflection of the incident light L10 on the portions 41a is reduced, it is possible to improve a pixel separation property in which the light-receiving elements 31 are optically isolated.

The on-chip lens 45 condenses the incident light L10 on the vicinity of the center of each light-receiving element 31, and thus photoelectric conversion of the incident light L10 near the PN semiconductor region 30 is reduced. Therefore, it is possible to suppress extra-photoelectric conversion. Thus, since unintended inflow of charges into the DET 22A and the DET 22B can be reduced, it is possible to further improve the pixel separation property.

1.8 Reading Operation Example of Unit Pixel

Next, a reading operation upon measuring a distance to a target object using the solid-state imaging device 100 that has the foregoing structure in accordance with an indirect ToF scheme will be described in detail with reference to FIGS. 1, 3, and 9 and the like.

When a distance to a target object is measured in accordance with the indirect ToF scheme, light (for example, infrared light) with a specific wavelength is emitted toward the target object from the light-emitting unit 13 (see FIG. 1). When the light is reflected from the target object and is incident as reflected light on the light-receiving unit 14, the semiconductor substrate 40 of the solid-state imaging device 100 photoelectrically converts the incident reflected light to generate charges in accordance with the amount of light.

At this time, the vertical driving circuit 103 drives the unit pixels 20 and distributes the signals in accordance with the charges obtained through the photoelectric conversion to the FDs 26 of the two reading circuits 20A and 20B.

For example, at a certain timing, the vertical driving circuit 103 applies a voltage to two MIXs 21 in the same unit pixel 20. Specifically, for example, the vertical driving circuit 103 applies the reading voltage VmixA of 1.5 V (volts) to the MIX 21 of the signal extraction unit 30A and applies the reading voltage VmixB of 0 V to the MIX 21 of the signal extraction unit 30B.

In this state, when light is incident inside the semiconductor substrate 40 via the on-chip lens 45, the light is photoelectrically converted, and the charges are thus generated, the generated charges are guide to the MIX 21 of the signal extraction unit 30A and are taken by the DET 22A of the signal extraction unit 30A.

In this case, the charges (that is, electrons) generated through the photoelectric conversion are used as signal carriers for detecting a signal in accordance with the amount of light incident on the light-receiving element 31, that is, an amount of received light.

The charges taken by the DET 22A are transferred to the FD 26 via the transfer transistor 24 of the reading circuit 20A. Thus, a voltage with a voltage value in accordance with the charges accumulated in the FD 26 is applied to the gate of the amplification transistor 27 in the reading circuit 20A. As a result, the voltage with the voltage value in accordance with the amount of charge accumulated in the FD 26 appears in the vertical signal line VSL0 via the selection transistor 28.

The voltage appearing in the vertical signal line VSL0 is read as a digital pixel signal by the column processing circuit 104 and is input to the signal processing unit 106.

At a subsequent timing, a voltage is applied to two MIXs 21 of the light-receiving element 31 so that an electric field is generated in an opposite direction to an electric field generated until now in the light-receiving element 31. Specifically, for example, the vertical driving circuit 103 applies the reading voltage VmixB of 1.5 V (volts) to the MIX 21 of the signal extraction unit 30B and applies the reading voltage VmixA of 0 V to the MIX 21 of the signal extraction unit 30A.

In this state, when light is incident inside the semiconductor substrate 40 via the on-chip lens 45, the light is photoelectrically converted, and the charges are thus generated, the generated charges are guide to the MIX 21 of the signal extraction unit 30B and are taken by the DET 22B of the signal extraction unit 30B. The signal carriers may be electrons, as described above.

The charges taken by the DET 22B are transferred to the FD 26 via the transfer transistor 24 of the reading circuit 20B. Thus, a voltage with a voltage value in accordance with the charges accumulated in the FD 26 is applied to the gate of the amplification transistor 27 in the reading circuit 20B. As a result, the voltage with the voltage value in accordance with the amount of charge accumulated in the FD 26 appears in the vertical signal line VSL1 via the selection transistor 28.

The voltage appearing in the vertical signal line VSL1 is read as a digital pixel signal by the column processing circuit 104 and is input to the signal processing unit 106.

The signal processing unit 106 calculates, for example, distance information indicating a distance to a target object based on a difference between pixel signals read from the two reading circuits 20A and 20B and outputs the calculated distance information to the outside.

As described above, a method of distributing the signal carriers to the two signal extraction units 30A and 30B and calculating the distance information based on the pixel signals read by the reading circuits 20A and 20B is called as an indirect ToF scheme.

1.9 Layout Example of MIX Wiring

Next, a planar layout example of wirings for applying the reading voltages VmixA and VmixB to the MIX 21 (hereinafter referred to as MIX wirings) in each light-receiving element 31 will be described according to a comparative example.

1.9.1 MIX Wiring According to Comparative Example

Figure 12:
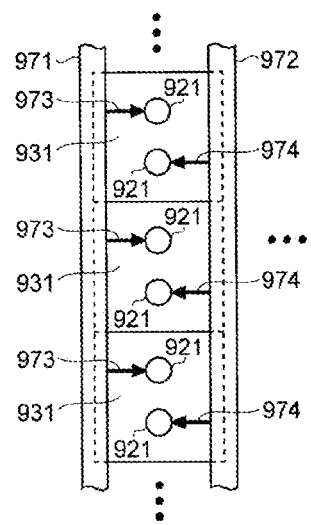
FIG. 12 is a diagram illustrating a planar layout example of a MIX wiring according to a comparative example.

FIG. 12 is a diagram illustrating a planar layout example of a MIX wiring according to the comparative example exemplified in FIG. 4. As illustrated in FIG. 12, in the comparative example, two MIXs 921 are disposed near the center of each light-receiving element 931. Therefore, in a configuration according to the comparative example, for example, it is necessary to provide a branch wiring 973 for applying the reading voltage VmixA to one MIX 921 from one main wiring 971 between two main wirings 971 and 972 extending along a boundary of the adjacent light-receiving elements 931 in the column direction, and it is necessary to provide a branch wiring 974 for applying the reading voltage VmixB to the other MIX 921 from the other main wiring 972.

Here, since the branch wirings 973 and 974 are not optically shielded from light by light shielding films or the like, incident light is reflected by the branch wirings 973 and 974. As a result, there is a probability of a pixel separation property deteriorating.

1.9.2 MIX Wiring According to First Embodiment

Figure 13:
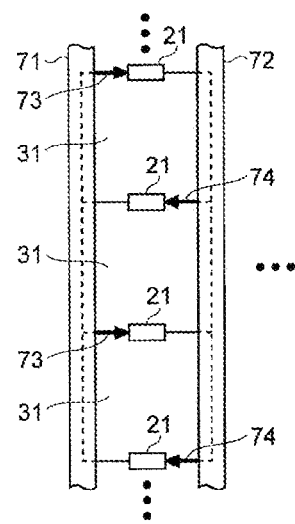
FIG. 13 is a diagram illustrating a planar layout example of a MIX wiring according to the first embodiment.

FIG. 13 is a diagram illustrating a planar layout example of the MIX wiring according to the embodiment. As illustrated in FIG. 13, in the embodiment, the MIX 21 is disposed at the boundary of the adjacent light-receiving elements 31. Therefore, in the embodiment, it is possible to dispose a branch wiring 73 for applying the reading voltage VmixA to one MIX 21 from one main wiring 71 between two main wirings 71 and 72 extending along the boundary of the adjacent light-receiving elements 31 in the column direction and a branch wiring 74 for applying the reading voltage VmixB to the other MIX 21 from the other main wiring 72 in regions optically shielded from light by light-shielding films 44. Thus, since the reflection of the incident light from the branch wirings 73 and 74 can be reduced, it is possible to suppress deterioration in the pixel separation property as a result.

1.10 Driving Example Upon Reading Pixel Signal

Next, several driving examples upon reading a pixel signal from the pixel array unit 101 will be described.

1.10.1 First Driving Example

Figure 14:
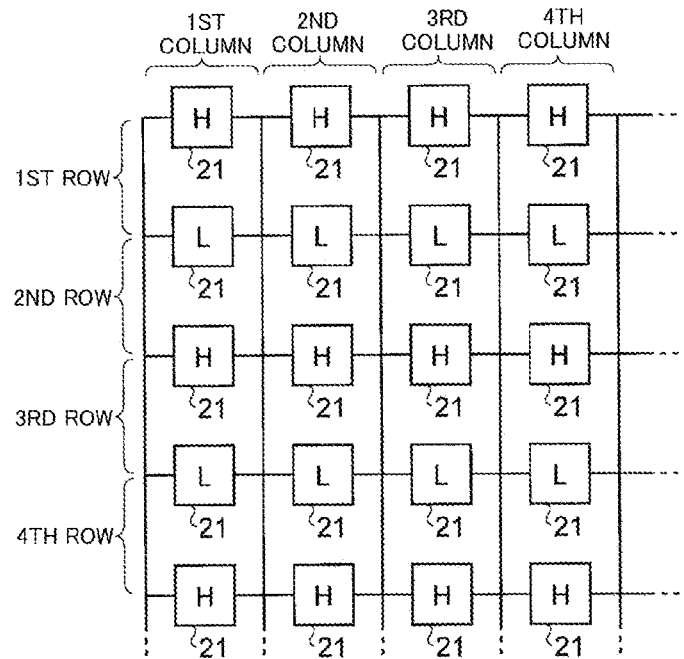
FIG. 14 is a diagram (part 1) illustrating a first driving example according to the first embodiment.
Figure 15:
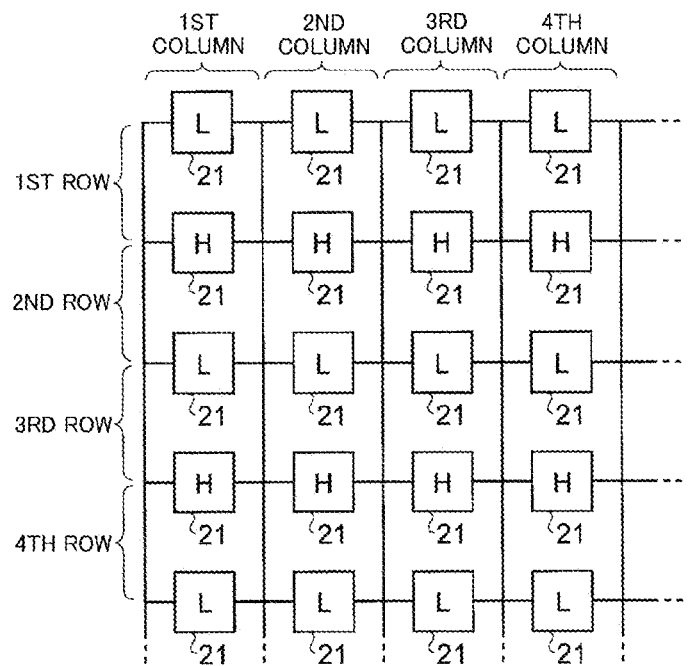
FIG. 15 is a diagram (part 2) illustrating the first driving example according to the first embodiment.

First, a first driving example will be described. FIGS. 14 and 15 are diagrams illustrating the first driving example according to the embodiment.

In the first driving example, first, for the unit pixels 20 in odd rows, the reading circuits 20A connected to the DETs 22A are driven to read the pixel signals. For the unit pixels 20 in even rows, the reading circuits 20B connected to the DETs 22B are driven to read the pixel signals. Subsequently, for the unit pixels 20 in odd rows, the reading circuits 20B connected to the DETs 22B are driven to read the pixel signals. For the unit pixels 20 in the even rows, the reading circuits 20A connected to the DETs 22A are driven to read the pixel signals.

Specifically, as illustrated in FIG. 14, a reading voltage Vmix with a high level (for example, 1.5 V: referred to as 'H' in the drawing) (to facilitate description, referred to as VmixA) is applied to the MIXs 21 located at upper boundaries in the light-receiving elements 31 in odd rows (in other words, lower boundaries in the light-receiving elements 31 in even rows). A reading voltage Vmix with a low level (for example, 0 V: referred to as 'L' in the drawing) (to facilitate description, referred to as VmixB) is applied to the MIXs 21 located at lower boundaries in the light-receiving elements 31 in odd rows (in other words, upper boundaries in the light-receiving elements 31 in even rows).

Upon applying the reading voltages VmixA and VmixB, negative charges (electrons) generated in the semiconductor substrate 40 are taken by the upper DETs 22A in the light-receiving elements 31 in the odd rows and are taken by the lower DETs 22B in the light-receiving elements 31 in the even rows.

Accordingly, for the light-receiving elements 31 in the odd rows, the reading circuits 20A are driven to read the pixel signals. For the light-receiving elements 31 in the even rows, the reading circuits 20B are driven to read the pixel signals.

Subsequently, as illustrated in FIG. 15, the reading voltage VmixB with the high level (for example, 1.5 V) is applied to the MIXs 21 located at lower boundaries in the light-receiving elements 31 in odd rows (in other words, upper boundaries in the light-receiving elements 31 in even rows). The reading voltage VmixA with the low level (for example, 0 V) is applied to the MIXs 21 located at upper boundaries in the light-receiving elements 31 in odd rows (in other words, lower boundaries in the light-receiving elements 31 in even rows).

Upon applying the reading voltages VmixA and VmixB, negative charges (electrons) generated in the semiconductor substrate 40 are taken by the lower DETs 22B in the light-receiving elements 31 in the odd rows and are taken by the upper DETs 22A in the light-receiving elements 31 in the even rows.

Accordingly, for the light-receiving elements 31 in the odd rows, the reading circuits 20B are driven to read the pixel signals. For the light-receiving elements 31 in the even rows, the reading circuits 20A are driven to read the pixel signals.

By performing the above operation for one light emission of the light-emitting unit 13, it is possible to obtain a time of flight of the laser light L1 output from the light-emitting unit 13 and incident as the reflected light L2 on the light-receiving unit 14 from a ratio of charges accumulated in the DET 22A and the DET 22B in one light-receiving element 31. From this ratio, it is possible to acquire information regarding the distance to the object 90.

1.10.1.1 MIX Wiring in First Driving Example

As illustrated in FIGS. 14 and 15, the MIX wirings for applying the common reading voltage VmixA to the MIXs 21 located at the upper boundaries in the light-receiving elements 31 in the odd rows and applying another common reading voltage VmixB to the MIXs 21 located at the upper boundaries in the light-receiving elements 31 in the even rows connect the main wirings 71 located at the left boundaries in the light-receiving elements 31 in the odd columns and the MIXs 21 located at the upper boundaries in the light-receiving elements 31 in the odd rows to the branch wirings 73 and connect the main wirings 72 located at the left boundaries in the light-receiving elements 31 in the even columns and the MIXs 21 located at the upper boundaries in the light-receiving elements 31 in the even rows to the branch wirings 74, for example, as illustrated in FIG. 16, so that the configuration in which the reading voltage VmixA is applied to the main wirings 71 and the reading voltage VmixB is applied to the main wirings 72 can be realized.

1.10.2 Second Driving Example

Figure 17:
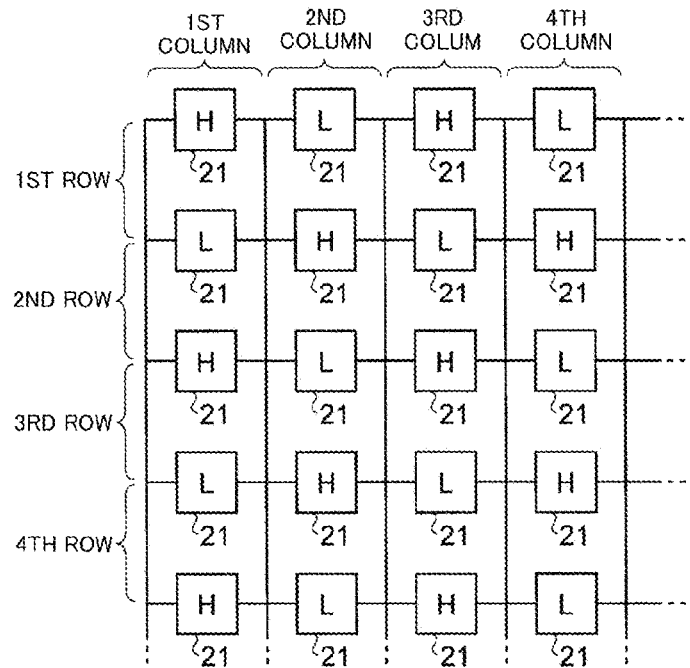
FIG. 17 is a diagram (part 1) illustrating a second driving example according to the first embodiment.
Figure 18:
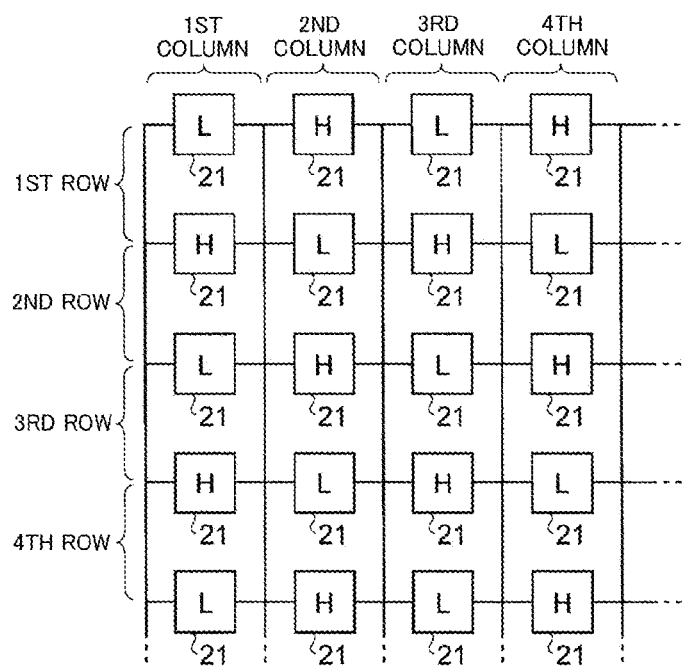
FIG. 18 is a diagram (part 2) illustrating the second driving example according to the first embodiment.

Next, a second driving example will be described. FIGS. 17 and 18 are diagrams illustrating the second driving example according to the embodiment.

In the second driving example, first, for the light-receiving elements 31 in the odd rows, the reading circuits 20A connected to the DET 22A in the light-receiving elements 31 in the odd columns are driven to read the pixel signals and the reading circuits 20B connected to the DETs 22B in the light-receiving elements 31 in the even columns are driven to read the pixel signals. For the light-receiving elements 31 in the even rows, the reading circuits 20B connected to the DETs 22B in the light-receiving elements 31 in the odd columns are driven to read the pixel signals and the reading circuits 22A connected to the DETs 22A in the light-receiving elements 31 in the even columns are driven to read the pixel signals.

Subsequently, for the light-receiving elements 31 in the odd rows, the reading circuits 20B connected to the DET 22B in the light-receiving elements 31 in the odd columns are driven to read the pixel signals and the reading circuits 20A connected to the DETs 22A in the light-receiving elements 31 in the even columns are driven to read the pixel signals. For the light-receiving elements 31 in the even rows, the reading circuits 20A connected to the DETs 22A in the light-receiving elements 31 in the odd columns are driven to read the pixel signals and the reading circuits 22A connected to the DETs 22B in the light-receiving elements 31 in the even columns are driven to read the pixel signals.

Specifically, as illustrated in FIG. 17, the reading voltage Vmix with a high level (for example, 1.5 V) (to facilitate description, which is referred to as VmixA) is applied to the MIXs 21 located at the upper boundaries in the light-receiving elements 31 in the odd rows and the odd columns (in other words, the lower boundaries in the light-receiving elements 31 in the even rows and the odd columns) and the MIXs 21 located at the upper boundaries in the light-receiving elements 31 in the even rows and the even columns (in other words, the upper boundaries in the light-receiving elements 31 in the odd rows and the even columns). The reading voltage Vmix with a low level (for example, 0 V) (to facilitate description, which is referred to as VmixB) is applied to the MIXs 21 located at the upper boundaries in the light-receiving elements 31 in the odd rows and the even columns (in other words, the lower boundaries in the light-receiving elements 31 in the even rows and the even columns) and the MIXs 21 located at the upper boundaries in the light-receiving elements 31 in the even rows and the odd columns (in other words, the lower boundaries in the light-receiving elements 31 in the odd rows and the odd columns).

Upon applying the reading voltages VmixA and VmixB, negative charges (electrons) generated in the semiconductor substrate 40 are taken by the upper DETs 22A in the light-receiving elements 31 in the odd rows and the odd columns and the light-receiving elements 31 in the even rows and the even columns and are taken by the lower DETs 22B in the light-receiving elements 31 in the odd rows and the even columns and the light-receiving elements 31 in the even rows and the odd columns.

Accordingly, for the light-receiving elements 31 in the odd rows and the odd columns and the light-receiving elements 31 in the even rows and the even columns, the reading circuits 20A are driven to read the pixel signals. For the light-receiving elements 31 in the odd rows and the even columns and the light-receiving elements 31 in the even rows and the odd columns, the reading circuits 20B are driven to read the pixel signals.

Subsequently, as illustrated in FIG. 18, the reading voltage VmixB with the high level (for example, 1.5 V) is applied to the MIXs 21 located at the lower boundaries in the light-receiving elements 31 in the odd rows and the odd columns and the MIXs 21 located at the lower boundaries in the light-receiving elements 31 in the even rows and the even columns. The reading voltage VmixA with the low level (for example, 0 V) is applied to the MIXs 21 located at the lower boundaries in the light-receiving elements 31 in the odd rows and the even columns and the MIXs 21 located at the lower boundaries in the light-receiving elements 31 in the even rows and the odd columns.

Upon applying the reading voltages VmixA and VmixB, negative charges (electrons) generated in the semiconductor substrate 40 are taken by the lower DETs 22B in the light-receiving elements 31 in the odd rows and the odd columns and the light-receiving elements 31 in the even rows and the even columns and are taken by the upper DETs 22A in the light-receiving elements 31 in the odd rows and the even columns and the light-receiving elements 31 in the even rows and the odd columns.

Accordingly, for the light-receiving elements 31 in the odd rows and the odd columns and the light-receiving elements 31 in the even rows and the even columns, the reading circuits 20B are driven to read the pixel signals. For the light-receiving elements 31 in the odd rows and the even columns and the light-receiving elements 31 in the even rows and the odd columns, the reading circuits 20A are driven to read the pixel signals.

By performing the above operation for one light emission of the light-emitting unit 13, it is possible to obtain a time of flight of the laser light L1 output from the light-emitting unit 13 and incident as the reflected light L2 on the light-receiving unit 14 from a ratio of charges accumulated in the DET 22A and the DET 22B in one light-receiving element 31. From this ratio, it is possible to acquire information regarding the distance to the object 90.

1.10.2.1 MIX Wiring in Second Driving Example

Figure 19:
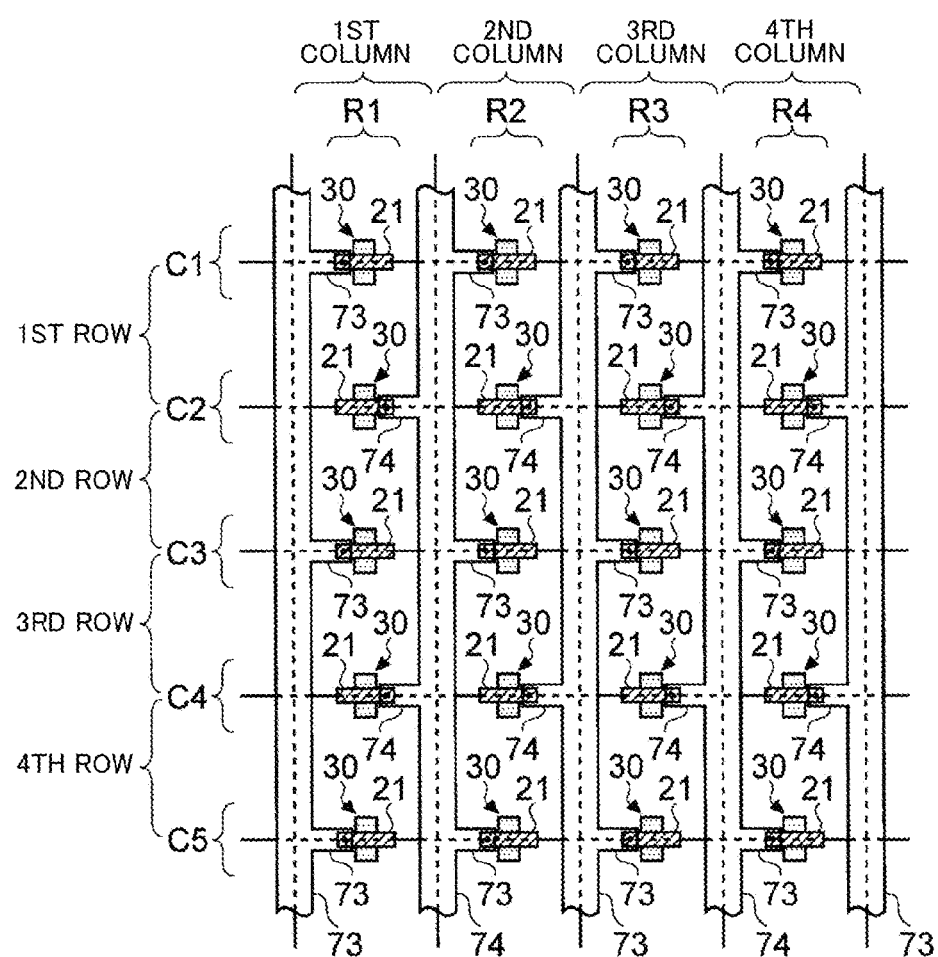
FIG. 19 is a plan view illustrating a layout example of the MIX wiring to realize the second driving example according to the first embodiment.

As illustrated in FIGS. 17 and 18, the MIX wirings for applying the common reading voltage VmixA to the MIXs 21 located at the upper boundaries in the light-receiving elements 31 in the odd rows and the odd columns and the light-receiving elements 31 in the even rows and the even columns and applying another common reading voltage VmixB to the MIXs 21 located at the upper boundaries in the light-receiving elements 31 in the odd rows and the even columns and the light-receiving elements 31 in the even rows and the odd columns connect the main wirings 71 located at the left boundaries in the light-receiving elements 31 in the odd columns and the MIXs 21 located at the upper boundaries in the light-receiving elements 31 in the odd rows and the odd columns and the light-receiving elements 31 in the even rows and the even columns to the branch wirings 73 and connect the main wirings 72 located at the left boundaries in the light-receiving elements 31 in the even columns and the MIXs 21 located at the upper boundaries in the light-receiving elements 31 in the odd rows and the even columns and the light-receiving elements 31 in the even rows and the odd columns to the branch wirings 74, for example, as illustrated in FIG. 19, so that the configuration in which the reading voltage VmixA is applied to the main wirings 71 and the reading voltage VmixB is applied to the main wirings 72 can be realized.

1.11 Electric Field in Semiconductor Substrate

Next, an electric field formed in the semiconductor substrate 40 in the light-receiving elements 31 according to the embodiment will be described according to a comparative example.

Figure 20:
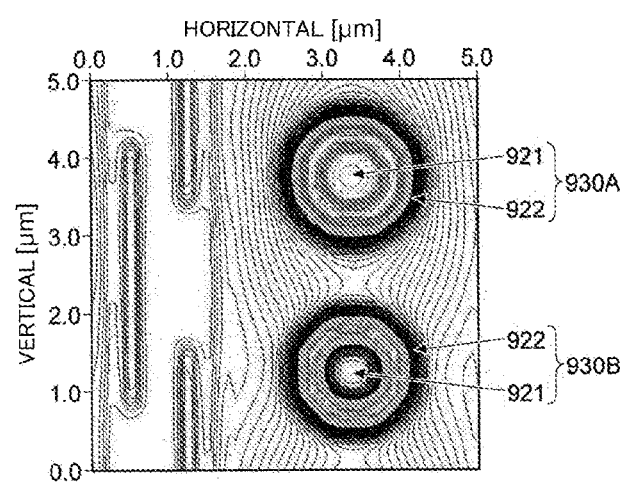
FIG. 20 is a plan view illustrating a simulation result of a potential formed in a semiconductor substrate of a light-receiving element according to a comparative example.
Figure 21:
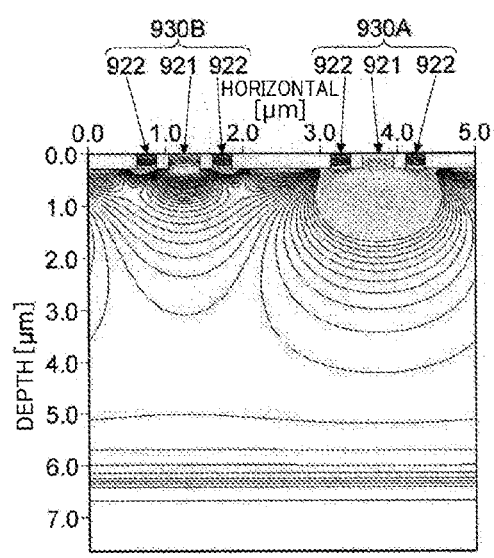
FIG. 21 is a vertical cross-sectional view illustrating a simulation result according to a comparative example.
Figure 22:
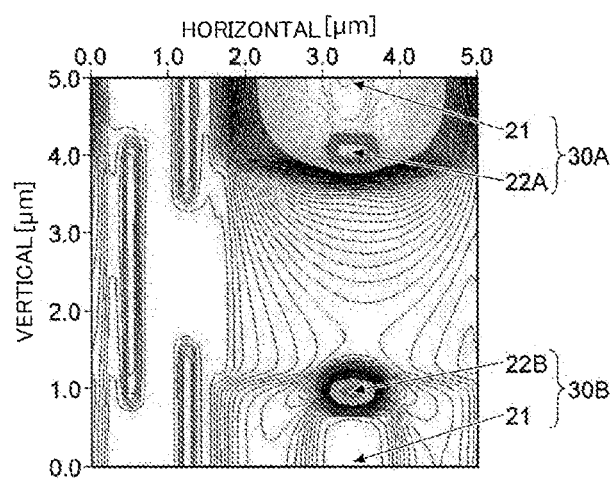
FIG. 22 is a plan view illustrating a simulation result of a potential formed in a semiconductor substrate of the light-receiving element according to the first embodiment.
Figure 23:
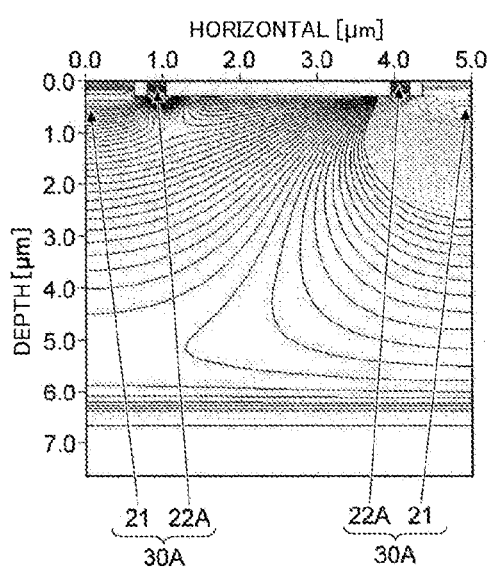
FIG. 23 is a vertical cross-sectional view illustrating a simulation result according to the first embodiment.

FIG. 20 is a plan view illustrating a simulation result of a potential formed in a semiconductor substrate of a light-receiving element according to the comparative example exemplified in FIG. 4. FIG. 21 is a vertical cross-sectional view illustrating the simulation result. On the other hand, FIG. 22 is a plan view illustrating a simulation result of a potential formed in a semiconductor substrate of the light-receiving element according to the embodiment. FIG. 23 is a vertical cross-sectional view illustrating a simulation result.

In the comparative example illustrated in FIGS. 20 and 21, the length of one side of each square light-receiving element 931 was set to 5µ and a distance between the center of the MIX 921 in the signal extraction unit 930A and the center of the MIX 921 in the signal extraction unit 930B was set to 2.5 µm. In the embodiment illustrated in FIGS. 22 and 23, the length of one side of each square light-receiving element 31 was set to 5µ. In this case, a distance between the centers of the MIXs 21 is 5 µm.

In FIGS. 20 and 21, the signal extraction unit 930A is a signal extraction side. A reading voltage VmixA of 1.2 V was applied to the MIX 921 of the signal extraction unit 930A and a reading voltage VmixB of 0 V was applied to the other MIX 921. In FIGS. 22 and 23, on the other hand, the reading voltage VmixA of 1.2 V was applied to the MIX 21 on the signal extraction side and the reading voltage VmixB of 0 V was applied to the other MIX 21. Further, in FIGS. 20 to 23, 2V was applied to each of the DETs 922, 22A, and 22B.

As understood from the comparison of FIGS. 20 and 22, in the comparative example exemplified in FIG. 20, equipotential lines in the circumference of the signal extraction unit 930B which is not on the signal extraction side are dense. This indicates that a region on which an electric field in the circumference of the signal extraction unit 930B is concentrated is formed. In this case, since movement of the charges generated near the signal extraction unit 930B to the signal extraction unit 930A is inhibited, the charges are not efficiently collected in the DET 922 of the signal extraction unit 930A, which deteriorates a contrast.

In the embodiment illustrated in FIG. 22, however, a region of an intense electric field formed in the circumference of the signal extraction unit 30B which is not on the signal extraction side is small. Accordingly, in the embodiment, since the charges generated near the signal extraction unit 30B can be efficiently taken in the DET 22A of the signal extraction unit 30A, it is possible to increase a contrast between the pixels.

As understood from the comparison of FIGS. 21 and 23, in the comparative example exemplified in FIG. 21, an interval between equipotential lines at a deep position of the semiconductor substrate is enlarged. This indicates that the electric field at the deep position of the semiconductor substrate is weak. In this case, the charges generated at the deep position of the semiconductor substrate are not efficiently collected in the DET 922 of the signal extraction unit 930A, which deteriorates a contrast.

In the embodiment exemplified in FIG. 23, however, the equipotential lines are formed at a narrow interval even at the deep position of the semiconductor substrate 40. This indicates that the electric field is intense at the deep position of the semiconductor substrate 40. Accordingly, in the embodiment, since the charges generated at the deep position of the semiconductor substrate 40 can be efficiently taken in the DET 22A of the signal extraction unit 30A, it is possible to increase a contrast between the pixels.

As described above, in the embodiment, since the charges can be efficiently collected in the DET 22A or 22B of the signal extraction side from a wide range of the semiconductor substrate 40 in each light-receiving element 31, it is possible to increase the contrast between the pixels.

1.12 Relation Between Operation Speed and Contrast

The fact that the charges can be efficiently collected in the DET 22A or 22B of the signal extraction side from a wide range of the semiconductor substrate 40 means that the unit pixels 20 according to the embodiment can perform a high-speed reading operation.

Figure 24:
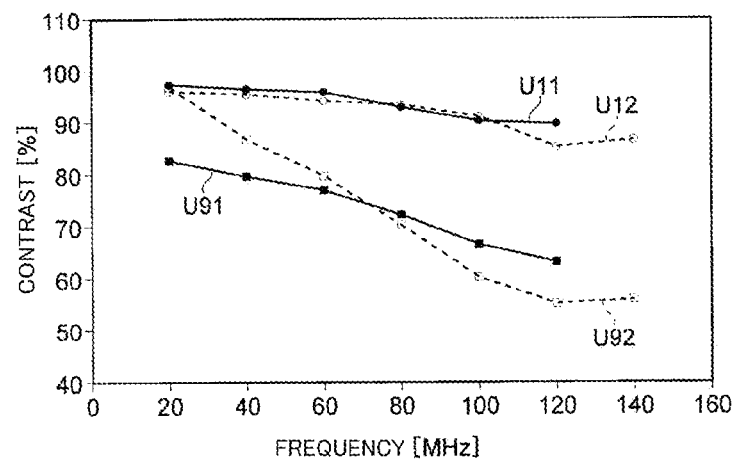
FIG. 24 is a diagram illustrating a contrast obtained for each operation frequency of a unit pixel according to a comparative example and a unit pixel according to the first embodiment.

FIG. 24 is a diagram illustrating a contrast obtained for each operation frequency of the unit pixel according to the comparative example exemplified in FIGS. 20 and 21 and the unit pixel according to the embodiment.

In FIG. 24, a solid line U11 indicates a contrast at each operation frequency in accordance with actually measured values of the unit pixels 20 according to the embodiment and a dashed line U12 indicates a contrast at each operation frequency in accordance with a simulation result of the unit pixels 20. A solid line U91 indicates a contrast at each operation frequency in accordance with actually measured values of the unit pixels according to the comparative example and a dashed line U12 indicates a contrast at each operation frequency in accordance with a simulation result of the unit pixels. In FIG. 24, for example, simulation conditions are assumed to be the same as conditions used in the simulation for obtaining the results of FIGS. 20 to 23.

As illustrated in FIG. 24, in the unit pixels 20 according to the embodiment, it is possible to obtain a higher contrast than in the unit pixels according to the comparative example in a wide range from at least 20 megahertz (MHz) to 120 MHz or 14 MHz in both the actually measured values and the simulation result. This indicates that, for example, the unit pixels 20 according to the embodiment can perform the reading operation at a higher operation speed than the unit pixels according to the comparative example.

1.13 Relation Between Operation Voltage and Contrast

The fact that the charges can be efficiently collected in the DETs 22 of the signal extraction side from a wide range of the semiconductor substrate 40 means that the unit pixels 20 according to the embodiment can perform an operation at a low operation voltage.

Figure 25:
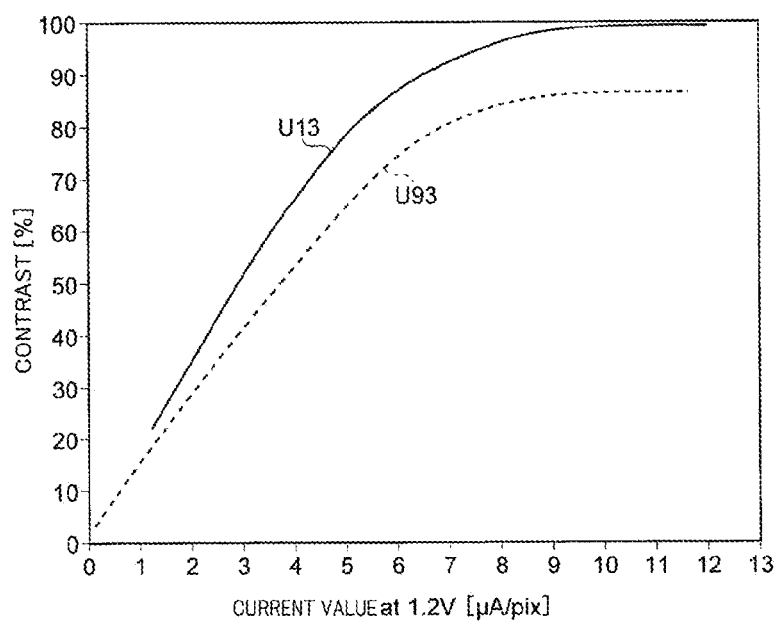
FIG. 25 is a diagram illustrating a contrast obtained for each current value flowing in an MIX of the unit pixel according to the comparative example and the unit pixel according to the first embodiment.

FIG. 25 is a diagram illustrating a contrast obtained for each current value flowing in the MIX of the unit pixel according to the comparative example exemplified in FIGS. 20 and 21 and the unit pixel according to the embodiment.

In FIG. 25, a solid line U13 indicates a contrast obtained at each current value of a current flowing in the MIX 21 of the unit pixel 20 according to the embodiment and a dashed line U93 indicates a contrast obtained at each current value of a current flowing in the MIX 921 of the unit pixel according to the comparative example exemplified in FIGS. 20 and 21.

As understood from the solid line U13 and the dashed line U93 in FIG. 25, when a current value of a current flowing in the MIX 21 or MIX 921 is set to be the same, the unit pixel 20 according to the embodiment can obtain a higher contrast than the unit pixel according to the comparative example. This indicates that the unit pixel 20 according to the embodiment can operate, for example, at a lower operation voltage than the unit pixel according to the comparative example. This also indicates that the unit pixel 20 according to the embodiment can reduce power consumption.

1.14 Operational Effects

As described above, according to the embodiment, since two vertically adjacent unit pixels 20 share one MIX 21, the distance between the centers of the MIXs 21 can be set to a pixel pitch of the unit pixel 20 as it is. Thus, since integration of the unit pixels 20 in the column direction can be increased, it is possible to improve ranging accuracy while suppressing deterioration in a resolution or increase a resolution while suppressing nominal cost of the ranging accuracy.

According to the embodiment, it is possible to reduce a region of an intense electric field formed in the circumference of the signal extraction unit 30B which is not on the signal extraction side or 30A. Accordingly, in the embodiment, since the charges generated near the signal extraction unit 30B which is not on the signal extraction side or 30A can also be efficiently taken in the DET 22A of the signal extraction unit 30A which is the signal extraction side or the DET 22B of the signal extraction unit 30B, it is possible to increase the contrast between the pixels.

Further, according to the embodiment, it is possible to efficiently collect the charges in the DET 22A or the DET 22B of the signal extraction side from the wide range of the semiconductor substrate 40, and thus it is possible to obtain the advantageous effect of performing the reading operation at a high speed and at a low operation voltage.

In the embodiment, the case in which the semiconductor substrate 40 is a p-type well, the MIX 21 is an p-type conductive p+ semiconductor region, and the DET 22A and the DET 22B are n-type conductive n+ semiconductor regions has been exemplified, but the present disclosure is not limited thereto. For example, the semiconductor substrate 40 can be an n-type well, the MIX 21 can be an n-type conductive n+ semiconductor region, and the DET 22A and the DET 22B can be p-type conductive p+ semiconductor regions. The same goes for the following embodiments.

2. Second Embodiment

Next, a second embodiment will be described in detail below with reference to the drawings. In the following description, similar configurations, operations, and advantageous effects to those of the above-described embodiment are cited and repeated description will be omitted.

In the first embodiment, the case in which two light-receiving elements 31 arrayed in the column direction share one MIX 21 has been described as an example. In the second embodiment, on the other hand, a case in which four light-receiving elements 31 adjacent in the row direction and the column direction share one MIX 21 will be described as an example.

2.1 Planar Layout Example According to Second Embodiment

Figure 26:
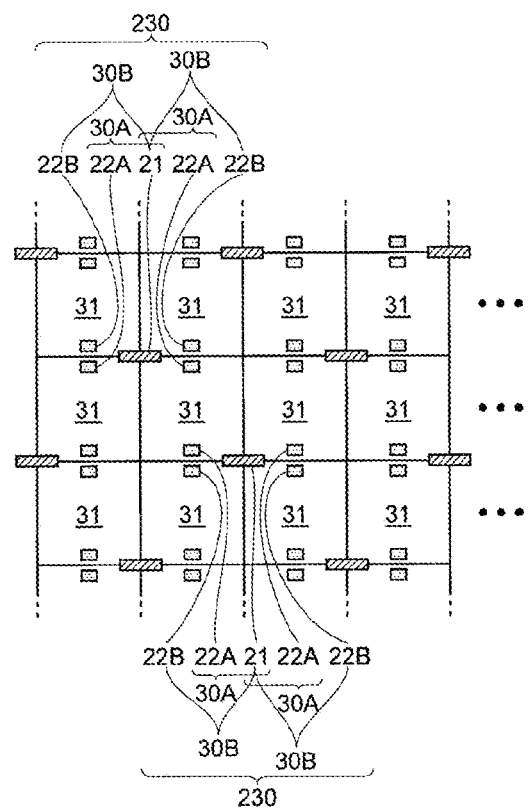
FIG. 26 is a plan view illustrating a layout example of light-receiving elements according to a second embodiment.
Figure 27:
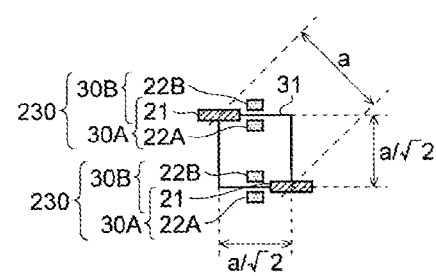
FIG. 27 is a plan view illustrating an example of the size of the light-receiving element illustrated in FIG. 26.

FIG. 26 is a plan view illustrating a layout example of light-receiving elements according to the embodiment. FIG. 27 is a plan view illustrating an example of the size of the light-receiving element illustrated in FIG. 26.

As illustrated in FIG. 26, the pixel array unit 101 according to the embodiment has a configuration in which the plurality of light-receiving elements 31 are arrayed in 2-dimensional lattice form as in the first embodiment.

Here, in the embodiment, four light-receiving elements 31 arrayed two by two in the row direction and the column direction form one group. The MIXs 21 are provided at a central portion in which the corners of the four light-receiving elements 31 gather and each of four corners of a rectangular region formed by four light-receiving elements 31. In other words, the MIXs 21 are located at a pair of diagonal angles of each light-receiving element 31. The MIX 21 provided at each of the four corners of the rectangular region formed by four light-receiving elements 31 is shared by four light-receiving elements 31 centering on the MIX 21.

Each MIX 21 forms the signal extraction unit 30A or 30B along with the DET 22A or 22B provided at each of the four light-receiving elements 31 sharing the MIX 21. Accordingly, the PN semiconductor region 230 according to the embodiment includes two signal extraction units 30A and two signal extraction units 30B.

The positions of the DETs 22A and 22B in each light-receiving element 31 may be similar positions to those of the first embodiment, for example, positions near the centers of the boundaries of the light-receiving elements 31 in the column direction.

Here, for example, when a is a distance between the centers of the MIXs 21 in the signal extraction units 30A and 30B and a region in which each light-receiving element 31 is formed is a square as in the light-receiving element 31 according to the first embodiment, as illustrated in FIG. 27, each light-receiving element 31 can be set as a square region of which each of a length in the column direction and a length in the row direction is $a/\sqrt{2}$. That is, as in the embodiment, when one MIX 21 is shared by four light-receiving elements 31 arrayed in two rows and two columns, a pixel pitch of the light-receiving element 31 can be set to $a/\sqrt{2}$ of a pixel pitch a in the first embodiment. Thus, since integration of the light-receiving elements 31 in the row direction and the column direction can be increased, it is possible to improve a resolution in the row direction and the column direction.

For example, compared to the first embodiment, the length of each light-receiving element 31 in the column direction can be reduced to $1/\sqrt{2}$. Thus, for example, compared to the first embodiment, a resolution in the column direction can be increased to $\sqrt{2}$ times. When the planar region of the light-receiving element 31 according to the first embodiment is set to a square, a resolution in the row direction can also be increased to √2 times.

2.2 Driving Examples Upon Reading Pixel Signals

Next, several driving examples upon reading the pixel signals from the pixel array unit 101 will be described.

Figure 28:
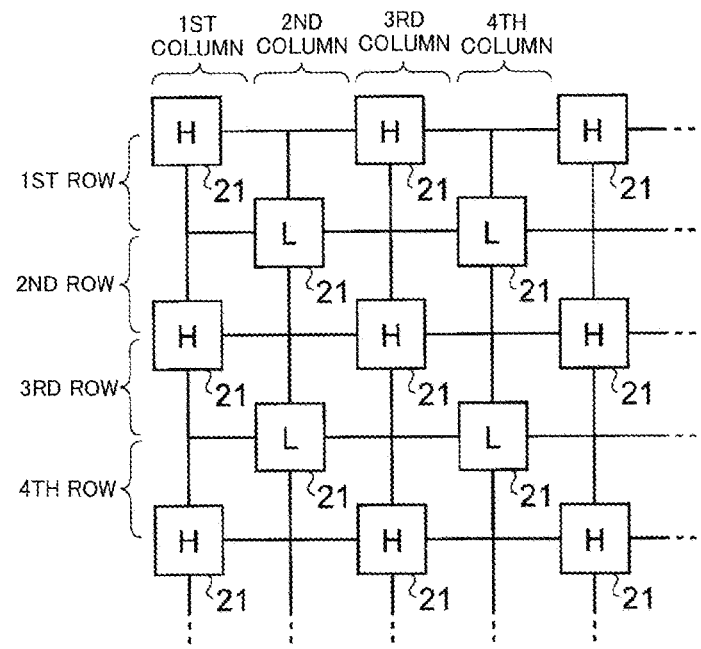
FIG. 28 is a diagram (part 1) illustrating a driving example according to the second embodiment.
Figure 29:
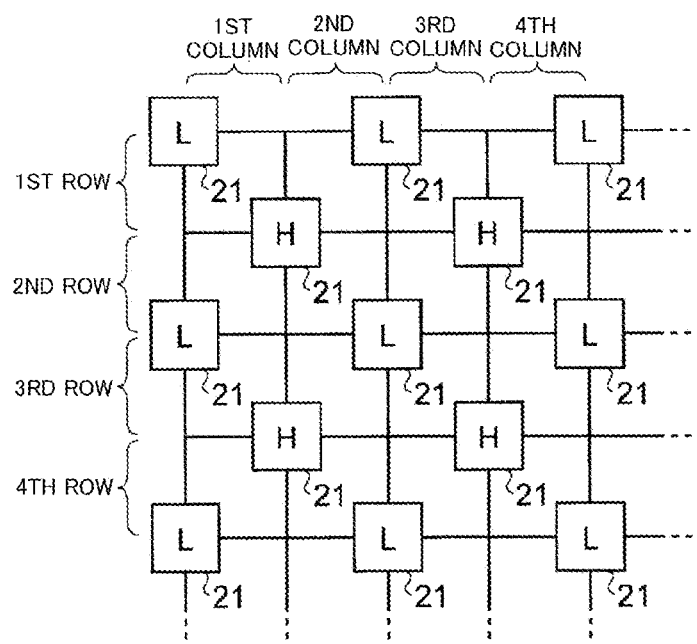
FIG. 29 is a diagram (part 2) illustrating a driving example according to the second embodiment.

FIGS. 28 and 29 are diagrams illustrating driving examples according to the embodiment. In the driving examples according to the embodiment, first, for the unit pixels 20 in odd rows, the reading circuits 20A connected to the DETs 22A are driven to read the pixel signals. For the unit pixels 20 in even rows, the reading circuits 20B connected to the DETs 22B are driven to read the pixel signals. Subsequently, for the unit pixels 20 in odd rows, the reading circuits 20B connected to the DETs 22B are driven to read the pixel signals. For the unit pixels 20 in the even rows, the reading circuits 20A connected to the DETs 22A are driven to read the pixel signals.

Specifically, as illustrated in FIG. 28, a reading voltage Vmix with a high level (for example, 1.5 V) (to facilitate description, referred to as VmixA) is applied to the MIXs 21 located at upper left boundaries of the light-receiving elements 31 in the odd columns in the light-receiving elements 31 in odd rows (in other words, lower right boundaries of the light-receiving elements 31 in even columns in the light-receiving elements 31 in the even rows). A reading voltage Vmix with a low level (for example, 0 V) (to facilitate description, referred to as VmixB) is applied to the MIXs 21 located at lower right boundaries in the light-receiving elements 31 in odd columns in the light-receiving elements 31 in odd rows (in other words, upper left boundaries in the light-receiving elements 31 in even columns in the light-receiving elements 31 in even rows).

Upon applying the reading voltages VmixA and VmixB, negative charges (electrons) generated in the semiconductor substrate 40 are taken by the upper DETs 22A in the light-receiving elements 31 in the odd rows and are taken by the lower DETs 22B in the light-receiving elements 31 in the even rows.

Accordingly, for the light-receiving elements 31 in the odd rows, the reading circuits 20A are driven to read the pixel signals. For the light-receiving elements 31 in the even rows, the reading circuits 20B are driven to read the pixel signals.

Subsequently, as illustrated in FIG. 29, the reading voltage VmixB with the high level (for example, 1.5 V) is applied to the MIXs 21 located at lower right boundaries of the light-receiving elements 31 in odd columns in the light-receiving elements 31 in odd rows (in other words, in upper left boundaries of the light-receiving elements 31 in even columns in the light-receiving elements 31 in even rows). The reading voltage VmixA with the low level (for example, 0 V) is applied to the MIXs 21 located at upper left boundaries of the light-receiving elements 31 in odd columns in the light-receiving elements 31 in odd rows (in other words, lower right boundaries of the light-receiving elements 31 in even columns in the light-receiving elements 31 in even rows).

Upon applying the reading voltages VmixA and VmixB, negative charges (electrons) generated in the semiconductor substrate 40 are taken by the lower DETs 22B in the light-receiving elements 31 in the odd rows and are taken by the upper DETs 22A in the light-receiving elements 31 in the even rows.

Accordingly, for the light-receiving elements 31 in the odd rows, the reading circuits 20B are driven to read the pixel signals. For the light-receiving elements 31 in the even rows, the reading circuits 20A are driven to read the pixel signals.

By performing the above operation for one light emission of the light-emitting unit 13, it is possible to obtain a time of flight of the laser light L1 output from the light-emitting unit 13 and incident as the reflected light L2 on the light-receiving unit 14 from a ratio of charges accumulated in the DET 22A and the DET 22B in one light-receiving element 31. From this ratio, it is possible to acquire information regarding the distance to the object 90.

2.3 Operational Effects

As described above, according to the embodiment, since one MIX 21 is shared by the four upper, lower, right, and left adjacent light-receiving elements 31 and the MIXs 21 are located at diagonal angles of the light-receiving elements 31, 1/√2 of the distance between the centers of the MIXs 21 can be set to the pixel pitch of the light-receiving elements 31. Thus, since integration of the light-receiving elements 31 in the row direction and the column direction can be increased, it is possible to increase ranging accuracy while suppressing deterioration in a resolution or increase the resolution while suppressing nominal cost of the ranging accuracy.

Since the other configurations, operations, and advantageous effects are similar to those of the above-described embodiment, detailed description thereof will be omitted here.

3. Third Embodiment

In the second embodiment, the case in which the DETs 22A and DETs 22B in each light-receiving elements 31 are located, for example, at the positions near the centers of the boundaries of the light-receiving elements 31 in the column direction has been exemplified (see FIG. 26). However, the positions of the DETs 22A and DETs 22B in each light-receiving elements 31 can be changed variously.

Figure 30:
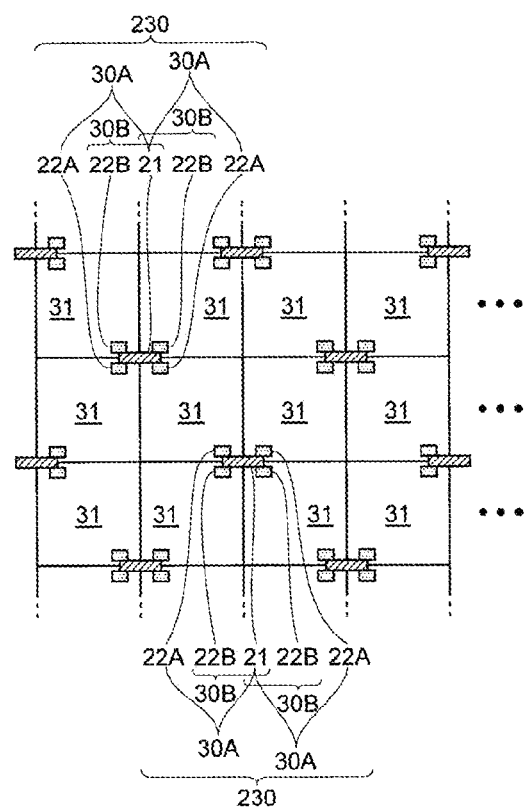
FIG. 30 is a plan view illustrating a layout example of a light-receiving element according to a third embodiment.

For example, as exemplified in FIG. 30, by disposing the DETs 22A and 22B in the light-receiving elements 31 closely to the corners in which the MIXs 21 are provided, the charges moving toward the MIXs 21 to which the reading voltage VmixA or VmixB is applied can be efficiently taken in the DETs 22A or DETs 22B. Therefore, it is possible to increase the contrast between the pixels.

Since the other configurations, operations, and advantageous effects are similar to those of the above-described embodiment, detailed description thereof will be omitted here.

4. Fourth Embodiment

Figure 31:
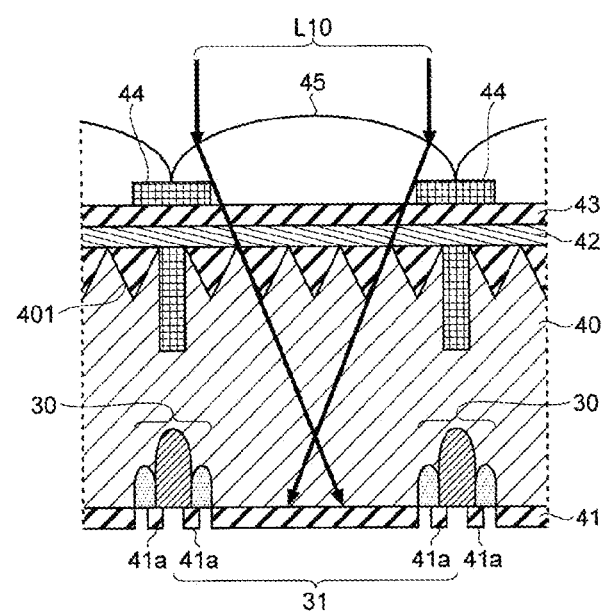
FIG. 31 is a cross-sectional view illustrating an overall configuration example of a light-receiving element according to a fourth embodiment.

In the above-described embodiments, for example, as exemplified in FIG. 31, by providing a groove 401 with a conical or quadrangular pyramidal shape in a light incidence surface of the semiconductor substrate 40, the light incidence surface of the semiconductor substrate 40 can also have a moth-eye structure.

In this way, when the light incidence surface of the semiconductor substrate 40 has the moth-eye structure, a reflection ratio on the light incidence surface can be reduced and more light can be incident on the semiconductor substrate 40. Therefore, it is possible to increase the contrast between the pixels.

The shape of the groove 401 is not limited to the conical or quadrangular pyramidal shape and can be modified to various shapes such as polygonal shapes of an elliptic conical shape and trigonal pyramidal shape.

As exemplified in FIG. 31, a pixel separation unit 402 that optically separates the adjacent light-receiving elements 31 from each other may be provided between the light-receiving elements 31 arrayed in a 2-dimensional lattice form. By providing the pixel separation unit 402 between the adjacent light-receiving elements 31, it is possible to prevent leakage of light to the adjacent light-receiving elements 31. Therefore, it is possible to improve a pixel separation property.

The pixel separation unit 402 can be formed, for example, by forming a trench along the boundary of the light-receiving elements 31 and implanting a light-shielding material such as tungsten (W) or a high-refractive index material (for example, a material that has a higher refractive index than the semiconductor substrate 40) in the trench. The light-shielding film 402 and the semiconductor substrate 40 can be electrically separated from each other using an insulation film or the like formed on the inner surface of the trench.

FIG. 31 exemplifies the so-called reverse deep trench isolation (RDTI) type of pixel separation unit 402 formed across a half portion of the rear surface (in the drawing, the upper surface) of the semiconductor substrate 40, but the present disclosure is not limited thereto. For example, various modifications can be made, such as a front full trench isolation (FFTI) type of pixel separation unit penetrating through the front and rear surfaces of the semiconductor substrate 40.

Since the other configurations, operations, and advantageous effects are similar to those of the above-described embodiment, detailed description thereof will be omitted here.

5. Application Examples

The technology of the present disclosure can be applied to various products. For example, the technology of the present disclosure may be realized as a device mounted on any type of moving body such as an automobile, an electric automobile, a hybrid electric automobile, a motorcycle, a bicycle, a personal mobility, an airplane, a drone, a ship, a robot, a construction machine, an agricultural machine (tractor).

Figure 32:
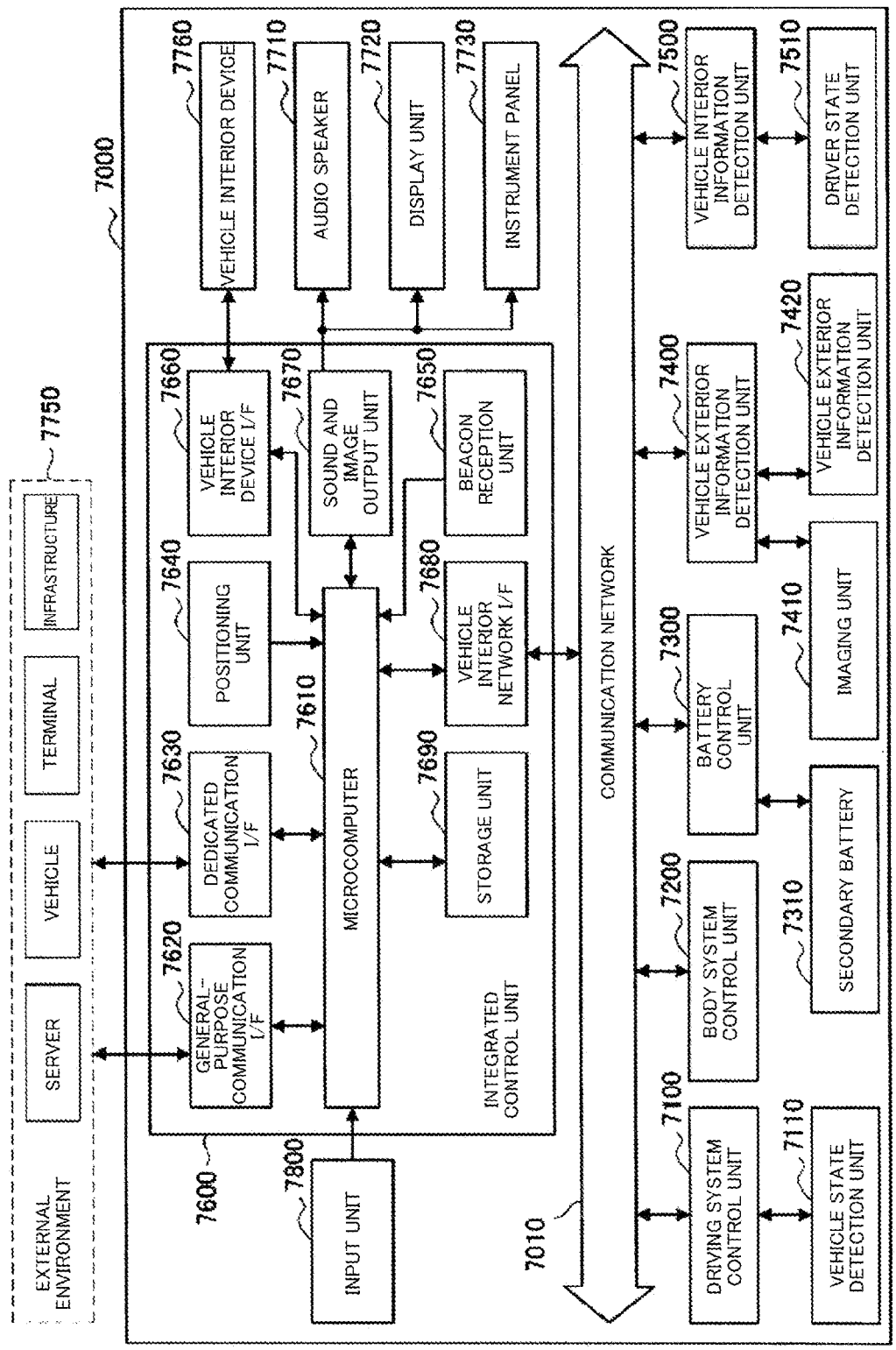
FIG. 32 is a block diagram illustrating an example of an overall configuration of a vehicle control system.

FIG. 32 is a block diagram illustrating an overall configuration example of a vehicle control system 7000 which is an example of a moving object control system to which the technology of the present disclosure can be applied. The vehicle control system 7000 includes a plurality of electronic control units connected via a communication network 7010. In the example illustrated in FIG. 32, the vehicle control system 7000 includes a driving system control unit 7100, a body system control unit 7200, a battery control unit 7300, a vehicle exterior information detection unit 7400, a vehicle interior information detection unit 7500, and an integrated control unit 7600. The communication network 7010 connecting these plurality of control units may be an in-vehicle communication network in conformity with any standard such as a controller area network (CAN), a local interconnect network (LIN), a local area network (LAN), or FlexRay (registered trademark), for example.

Each control unit includes a microcomputer that performs calculation processes in accordance with various programs, a storage unit that stores programs executed by the microcomputer, parameters used for various calculations, and the like, and a driving circuit that drives various control target devices. Each control unit includes a network I/F that performs communication with other control units via a communication network 7010 and includes a communication I/F that performs communication with devices or sensors inside and outside of the vehicle through wired communication or wireless communication. FIG. 32 illustrates, as functional configuration of an integrated control unit 7600, a microcomputer 7610, a general-purpose communication I/F 7620, a dedicated communication I/F 7630, a positioning unit 7640, a beacon reception unit 7650, a vehicle interior device I/F 7660, a sound and image output unit 7670, a vehicle interior network I/F 7680, and a storage unit 7690. As in other control units, a microcomputer, a communication I/F, a storage unit, and the like are included.

The driving system control unit 7100 controls operations of devices related to a driving system of a vehicle in accordance with various programs. For example, the driving system control unit 7100 functions as a control device such as a driving force generation device that generates a driving force of a vehicle, such as an internal combustion engine or a driving motor, a driving force transmission mechanism that transmits a driving force to wheels, a steering mechanism that adjusts a rudder angle of the vehicle, and a braking device that generates a braking force of the vehicle. The driving system control unit 7100 may function as a control device such as an antilock brake system (ABS) or an electronic stability control (ESC).

A vehicle state detection unit 7110 is connected to the driving system control unit 7100. The vehicle state detection unit 7110 includes, for example, at least one of a gyro sensor that detects an angular velocity of an axial rotation motion of a vehicle body, an acceleration sensor that detects an acceleration of a vehicle, and a sensor that detects an operation amount of an acceleration pedal, an operation amount of a brake pedal, a steering angle of a steering wheel, an engine speed or a rotation speed of wheels, and the like. The driving system control unit 7100 performs a calculation process using a signal input from the vehicle state detection unit 7110 and controls an internal combustion engine, a driving motor, an electric power steering device, a brake device, or the like.

The body system control unit 7200 controls operations of various devices equipped in the vehicle body in accordance with various programs. For example, the body system control unit 7200 functions as a control device of a keyless entry system, a smart key system, a power window device, or various lamps such as a head lamp, a back lamp, a brake lamp, a turn indicator, and a fog lamp. In this case, radio waves emitted from a portable device in place of a key or signals of various switches can be input to the body system control unit 7200. The body system control unit 7200 receives inputs of radio waves or signals and controls a door lock device, a power window device, and a lamp of the vehicle.

The battery control unit 7300 controls a secondary battery 7310 which is a power supply source of a driving motor in accordance with various programs. For example, information such as a battery temperature, a battery output voltage, or a remaining capacity of a battery is input from a battery device including the secondary battery 7310 to the battery control unit 7300. The battery control unit 7300 performs a calculation process using such a signal and performs temperature adjustment control of the secondary battery 7310 or control of a cooling device equipped in the battery device.

The vehicle exterior information detection unit 7400 detects external information of a vehicle on which the vehicle control system 7000 is mounted. For example, at least one of an imaging unit 7410 and a vehicle exterior information detection unit 7420 is connected to the vehicle exterior information detection unit 7400. The imaging unit 7410 includes at least one of a time-of-flight (ToF) camera, a stereo camera, a monocular camera, an infrared camera, and other cameras. The vehicle exterior information detection unit 7420 includes at least one of, for example, an environmental sensor detecting present weather or atmospheric phenomena and a surrounding information detection sensor detecting other vehicles, obstacles, pedestrians, and the like around a vehicle on which the vehicle control system 7000 is mounted.

The environmental sensor may be, for example, at least one of a raindrop sensor detecting rainy weather, a fog sensor detecting fog, a sunshine sensor detecting the degree of sunshine, and a snow sensor detecting snow. The surrounding information detection sensor may be at least one of an ultrasonic sensor, a radar device, and a light detection and ranging or laser imaging detection and ranging (LIDAR) device. The imaging unit 7410 and the vehicle exterior information detection unit 7420 may be included as independent sensors or devices or may be included as an integrated device of a plurality of sensors or devices.

Figure 33:
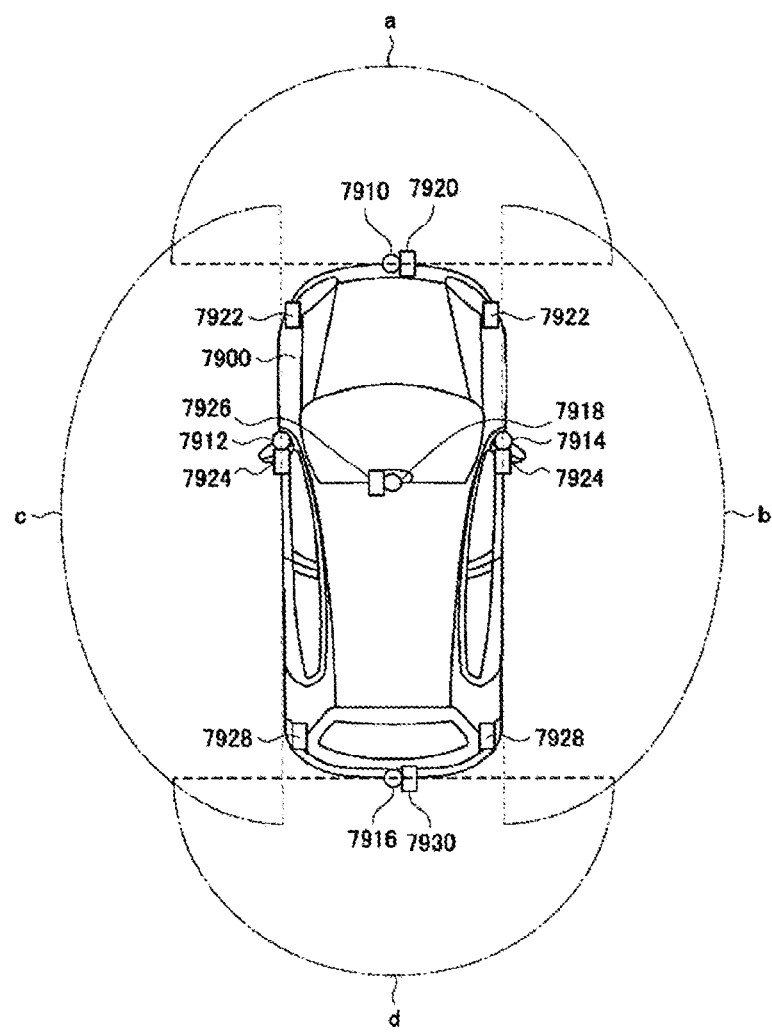
FIG. 33 is a diagram illustrating an example of positions at which a vehicle exterior information detection unit and an imaging unit are installed.

Here, FIG. 33 illustrates an example of positions at which the imaging unit 7410 and the vehicle exterior information detection unit 7420 are installed. The imaging units 7910, 7912, 7914, 7916, and 7918 are provided at, for example, at least one of the positions such as a front nose, side mirrors, a rear bumper, a backdoor, and an upper portion of a windshield of the vehicle interior of a vehicle 7900. The imaging unit 7910 provided in the front nose and the imaging unit 7918 provided in the upper portion of the windshield inside the vehicle mainly acquire images on the front side of the vehicle 7900. The imaging units 7912 and 7914 provided in the side mirrors mainly acquire images on the lateral sides of the vehicle 7900. The imaging unit 7916 provided in the rear bumper or the backdoor mainly acquires images on the rear side of the vehicle 7900. The imaging unit 7918 included in the upper portion of the windshield inside the vehicle is mainly used to detect front vehicles or pedestrians, obstacles, traffic signals, traffic signs, lanes, and the like.

FIG. 33 illustrates an example of imaging ranges of the imaging units 7910, 7912, 7914, and 7916. An imaging range a is an imaging range of the imaging unit 7910 provided in the front nose, imaging ranges b and c are imaging ranges of the imaging unit 7912 and 7914 provided in the side mirrors, and an imaging range d is an imaging range of the imaging unit 7916 provided in the rear bumper or the backdoor. For example, by superimposing the image data captured by the imaging units 7910, 7912, 7914, and 7916, it is possible to obtain a bird's eye view image in which the vehicle 7900 is viewed from the upper side.

Vehicle exterior information detection units 7920, 7922, 7924, 7926, 7928, and 7930 provided on upper portions of windshields of the front, rear, sides, corners, and the interior of the vehicle 7900 may be, for example, ultrasonic sensors or radar devices. The vehicle exterior information detection units 7920, 7926, and 7930 provided on the upper portions of the windshields of the front nose, the rear bumper, the backdoors, and the interior of the vehicle 7900 may be, for example, a LIDAR device. The vehicle exterior information detection units 7920 to 7930 are used to detect mainly front vehicles, pedestrians, obstacles, or the like.

FIG. 32 is referred to back to continue description. The vehicle exterior information detection unit 7400 causes the imaging unit 7410 to capture an image outside of the vehicle and receives captured image data. The vehicle exterior information detection unit 7400 receives detection information from the connected vehicle exterior information detection unit 7420. When the vehicle exterior information detection unit 7420 is an ultraviolet sensor, a radar device, or an LIDAR device, the vehicle exterior information detection unit 7400 causes ultrasonic waves, electromagnetic waves, or the like to be emitted and receives information regarding the received reflected waves. The vehicle exterior information detection unit 7400 may perform an object detection process or a distance detection process of people, vehicles, obstacles, signs, or characters on road surfaces based on the received information. The vehicle exterior information detection unit 7400 may perform an environment recognition process of recognizing rainfall, fog, or a road surface situation based on the received information. The vehicle exterior information detection unit 7400 may calculate a distance to an object outside of the vehicle based on the received information.

The vehicle exterior information detection unit 7400 may perform an image recognition process or a distance detection process of recognizing people, vehicles, obstacles, signs, or characters on road surfaces, or the like based on the received image data. The vehicle exterior information detection unit 7400 may perform a process such as distortion correction or positioning on the received image data and combine image data captured by the other imaging unit 7410 to generate a bird's eye view image or a panorama image. The vehicle exterior information detection unit 7400 may perform a viewpoint conversion process using the image data captured by the other imaging unit 7410.

The vehicle interior information detection unit 7500 detects information inside the vehicle. For example, a driver state detection unit 7510 that detects a driver state is connected to the vehicle interior information detection unit 7500. The driver state detection unit 7510 may include a camera that images a driver, a biological sensor that detects biological information of the driver, or a microphone that collects a sound inside the vehicle. The biological sensor is provided on, for example, a seat surface, a steering wheel, or the like and detects biological information of an occupant sitting on the seat or the driver holding the steering wheel. The vehicle interior information detection unit 7500 may calculate the degree of fatigue or the degree of concentration of the driver or determine whether the driver is drowsing based on detected information input from the driver state detection unit 7510. The vehicle interior information detection unit 7500 may perform a noise cancellation process or the like on a collected sound signal.

The integrated control unit 7600 controls general operations inside the vehicle control system 7000 in accordance with various programs. An input unit 7800 is connected to the integrated control unit 7600. The input unit 7800 is realized by, for example, a device such as a touch panel, a button, a microphone, a switch, or a lever which can be operated by an occupant performing an input. Data obtained by performing sound recognition on a sound input by the microphone may be input to the integrated control unit 7600. The input unit 7800 may be, for example, a remote control device using infrared light or other radio waves or may be an externally connected device such as a mobile phone or a personal digital assistant (PDA) corresponding to an operation of the vehicle control system 7000. The input unit 7800 may be, for example, a camera. In this case, an occupant can input information by a gesture. Alternatively, data obtained by detecting a motion of a wearable device worn by an occupant may be input. Further, the input unit 7800 may include, for example, an input control circuit or the like that generates an input signal based on information input by an occupant or the like using the foregoing input unit 7800 and outputs the input signal to the integrated control unit 7600. The occupant or the like operates the input unit 7800 to input various kinds of data to the vehicle control system 7000 or instruct the vehicle control system 7000 to perform a processing operation.

A storage unit 7690 may include a read-only memory (ROM) that stores various programs executed by the microcomputer and a random access memory (RAM) that stores various parameters, calculation results, sensor values, or the like. The storage unit 7690 may be realized by a magnetic storage device such as a hard disc drive (HDD), a semiconductor storage device, an optical storage device, or a magneto-optical storage device.

The general-purpose communication I/F 7620 is a general-purpose communication I/F that relays communication between various devices that are around an external environment 7750. On the general-purpose communication I/F 7620, a cellular communication protocol such as Global System of Mobile Communications (GSM: registered trademark), WiMAX (registered trademark), Long Term Evolution (LTE: registered trademark), or LTE-Advanced (LTE-A) or other wireless communication protocols such as wireless LAN (also referred to as Wi-Fi (registered trademark)), or Bluetooth (registered trademark) may be mounted. The general-purpose communication I/F 7620 may be connected to, for example, a device (for example, an application server or a control server) which is on an external network (for example, the Internet, a cloud network, or a unique service provider network) via a base station or an access point. The general-purpose communication I/F 7620 may be connected to, for example, a terminal (for example, a terminal or a machine type communication (MTC) terminal of a driver, a pedestrian, or a store) that is around the vehicle using a peer-to-peer (P2P) technology.

The dedicated communication I/F 7630 is a communication I/F that supports a communication protocol formulated for use in a vehicle. On the dedicated communication I/F 7630, for example, a standard protocol called a cellular communication protocol, or wireless access in vehicle environment (WAVE) or dedicated short range communications (DSRC) which is a combination of IEEE 802.11p of a lower layer and IEEE 1609 of a higher layer may be mounted. The dedicated communication I/F 7630 generally performs V2X communication that has a concept including one or more of vehicle-to-vehicle communication, vehicle-to-infrastructure communication, vehicle-to-home communication, and vehicle-to-pedestrian communication.

The positioning unit 7640 receives, for example, a global navigation satellite system (GNSS) signal from a GNSS satellite (for example, a global positioning system (GPS) signal from a GPS satellite) and performs positioning to generate positional information including latitude, longitude, and height of the vehicle. The positioning unit 7640 may specify a present position by exchanging signals with a wireless access point or may acquire positional information from a terminal such as a mobile phone, a PHS, or a smartphone that has a positioning function.

The beacon reception unit 7650 receives, for example, radio waves or electromagnetic waves emitted from radio stations provided on roads and acquires information such as a present position, congestion, traffic prohibition, or a required time. The function of the beacon reception unit 7650 may be included in the above-described dedicated communication I/F 7630.

The vehicle interior device I/F 7660 is a communication interface that relays connection between the microcomputer 7610 and various vehicle interior devices 7760 that are in the vehicle. The vehicle interior device I/F 7660 may establish wireless connection using a wireless communication protocol such as a wireless LAN, Bluetooth (registered trademark), near field communication (NFC), or wireless USB (WUSB). The vehicle interior device I/F 7660 may establish wired connection of universal serial bus (USB), High Definition Multimedia Interface (HDMI: registered trademark), Mobile High-definition Link (MHL), or the like via a connection terminal (not illustrated) (and a cable as necessary). The vehicle interior device 7760 may include at least one of, for example, a mobile device or a wearable device carried by an occupant and an information device brought or mounted in the vehicle. The vehicle interior device 7760 may include a navigation device that performs route searching to any destination. The vehicle interior device I/F 7660 exchanges control signals or data signals with the vehicle interior device 7760.

The vehicle interior network I/F 7680 is an interface that relays communication between the microcomputer 7610 and the communication network 7010. The vehicle interior network I/F 7680 transmits and receives signals or the like in conformity with a predetermined protocol supported by the communication network 7010.

The microcomputer 7610 of the integrated control unit 7600 controls the vehicle control system 7000 in accordance with various programs based on information acquired via at least one of the general-purpose communication I/F 7620, the dedicated communication I/F 7630, the positioning unit 7640, the beacon reception unit 7650, the vehicle interior device I/F 7660, and the vehicle interior network I/F 7680. For example, the microcomputer 7610 may calculate a control target value of a driving force generation device, a steering mechanism, or a braking device based on acquired information inside or outside of the vehicle and may output a control instruction to the driving system control unit 7100. For example, the microcomputer 7610 may perform coordinated control to realize functions of advanced driver assistance system (ADAS) including vehicle collision avoidance or shock absorption, following travel based on an inter-vehicle distance, vehicle speed maintenance travel, a vehicle collision warning, and a vehicle lane departure warning. The microcomputer 7610 may perform coordinated control to perform automated driving or the like in which a vehicle travels autonomously regardless of an operation of a driver by controlling a driving force generation device, a steering mechanism, or a braking device, or the like based on acquired surrounding information of the vehicle.

The microcomputer 7610 may generate 3-dimensional distance information between the vehicle and objects such as surrounding structures or people based on information acquired via at least one of the general-purpose communication I/F 7620, the dedicated communication I/F 7630, the positioning unit 7640, the beacon reception unit 7650, the vehicle interior device I/F 7660, and the vehicle interior network I/F 7680 and may generate local map information including surrounding information of a present position of the vehicle. The microcomputer 7610 may predict a danger such as collision of the vehicle, approach of a pedestrian, or entry into a traffic prohibition road based on the acquired information and may generate a warning signal. The warning signal may be, for example, a signal for generating a warning sound or turning on a warning lamp.

The sound and image output unit 7670 transmits an output signal of at least one of a sound and an image to an output device capable of notifying an occupant or the outside of the vehicle of information visually or auditorily. In the example of FIG. 32, an audio speaker 7710, a display unit 7720, and an instrument panel 7730 are exemplified as the output device. The display unit 7720 may include, for example, at least one of an on-board display and a head-up display. The display unit 7720 may have an augmented reality (AR) display function. The output device may be not only such a device but also another device such as a headphone, a wearable device such as a glasses-type display worn by an occupant, a projector, or a lamp. When the output device is a display device, the display device visually displays results obtained through various processes performed by the microcomputer 7610 or information received from another control unit in various formats such as text, images, tables, and graphs. When the output device is a sound output device, the sound output device converts an audio signal formed by reproduced sound data, acoustic data, or the like into an analog signal and outputs the analog signal auditorily.

In the example illustrated in FIG. 32, at least two control units connected via the communication network 7010 may be integrated as one control unit. Alternatively, an individual control unit may be configured by a plurality of control units. Further, the vehicle control system 7000 may include other control units (not illustrated). In the foregoing description, some or all of the functions of any control unit may be included in another control unit. That is, when information is transmitted and received via the communication network 7010, a predetermined calculation process may be performed by any control unit. Similarly, sensors or devices connected to any control unit may be connected to other control units and a plurality of control units may mutually transmit and receive detected information via the communication network 7010.

A computer program for realizing each function of the ToF sensor 1 according to the embodiment described with reference to FIG. 1 can be mounted in any control unit or the like. A computer-readable recording medium that stores the computer program can also be provided. The recording medium is, for example, a magnetic disk, an optical disc, a magneto-optical disk, or a flash memory. The foregoing computer program may be delivered via, for example, a network without using the recording medium.

In the above-described vehicle control system 7000, the ToF sensor 1 according to the embodiment described with reference to FIG. 1 can be applied to the integrated control unit 7600 in the application example illustrated in FIG. 32. For example, the control unit 11, the calculation unit 15, and the external I/F 19 of the ToF sensor 1 correspond to the microcomputer 7610, the storage unit 7690, and the vehicle interior network I/F 7680 of the integrated control unit 7600. The present disclosure is not limited thereto and the vehicle control system 7000 may correspond to the host 80 in FIG. 1.

At least some of the constituent elements of the ToF sensor 1 according to the embodiment described with reference to FIG. 1 may be realized in a module for the integrated control unit 7600 illustrated in FIG. 32 (for example, an integrated circuit module configured by one die). Alternatively, the ToF sensor 1 according to the embodiment described with reference to FIG. 1 may be realized by the plurality of control units of the vehicle control system 7000 illustrated in FIG. 32.

The embodiments of the present disclosure have been described above, but the technical scope of the present disclosure is not limited to the above-described embodiments as they are, and can be modified in various forms within the scope of the present disclosure without departing from the gist of the present disclosure. The constituent elements according to other embodiments and modification examples may be appropriately combined.

The advantageous effects in the embodiments described in the present specification are merely exemplary and are not limited, and other advantageous effects may be obtained.

The present technology can be configured as follows.

(1)

A light-receiving element comprising:

a semiconductor substrate;

a light-shielding film provided on a first surface of the semiconductor substrate and having a lattice form in which openings are arrayed in a matrix form;

a plurality of first semiconductor regions arrayed in a matrix form on a second surface opposite to the first surface of the semiconductor substrate;

a plurality of second semiconductor regions provided in an adjacent region which is the second surface of the semiconductor substrate and interposes each of the first semiconductor regions in a column direction; and a wiring layer provided on the second surface of the semiconductor substrate and electrically connected to the first semiconductor regions, wherein the first semiconductor region is located in a corresponding region with the light-shielding film and the first surface of the semiconductor substrate interposed therebetween, and the wiring layer includes a main wiring extending in the column direction in the corresponding regions with the light-shielding film and the first surface of the semiconductor substrate interposed therebetween and a branch wiring extending in a row direction in the corresponding regions with the light-shielding film and the first surface of the semiconductor substrate interposed therebetween and connecting the main wiring to each of the first semiconductor regions.

(2)

The light-receiving element according to (1), wherein the first semiconductor region is provided in each region extending in the row direction in the light-shielding film.

(3)

The light-receiving element according to (1) or (2), wherein the main wiring includes a first main wiring extending in the column direction on a first side of the first semiconductor region in an odd column and a second main wiring extending in the column direction on the first side of the first semiconductor region in an even column, and of the plurality of first semiconductor regions, the first semiconductor regions in odd rows are connected to the first main wirings via the branch wirings and the second semiconductor regions in even rows are connected to the second main wirings via the branch wirings.

(4)

The light-receiving element according to (1) or (2), wherein the main wiring includes a first main wiring extending in the column direction on a first side of the first semiconductor region in an odd column and a second main wiring extending in the column direction on the first side of the first semiconductor region in an even column, of the plurality of first semiconductor regions in the odd columns, the first semiconductor regions in the odd rows are connected to the first main wirings via the branch wirings and the first semiconductor regions in the even rows are connected to the second main wirings via the branch wirings, and of the first semiconductor regions in the even columns, the first semiconductor regions in the odd rows are connected to the second main wirings via the branch wirings and the first semiconductor regions in the even rows are connected to the first main wirings via the branch wirings.

(5)

The light-receiving element according to any one of (1) to (4), wherein the second semiconductor region has a conductive type opposite to the first semiconductor region.

(6)

The light-receiving element according to any one of (1) to (5), further comprising a plurality of on-chip lenses arrayed in a matrix form on the light-shielding film.

(7)

The light-receiving element according to (1), wherein the first surface of the semiconductor substrate has a moth-eye structure.

(8)

A light-receiving element including:
a semiconductor substrate in which a plurality of light-receiving elements are arrayed in a matrix form;
light-shielding films provided on a first surface of the semiconductor substrate in a lattice form at boundaries of the plurality of light-receiving elements;
first semiconductor regions provided on a second surface opposite to the first surface of the semiconductor substrate in portions in which corners of four light-receiving elements gather among the plurality of light-receiving elements and four corners of a rectangular region formed by the four light-receiving elements;
second semiconductor regions provided on the second surface of the semiconductor substrate at positions at which boundaries extending in a row direction among boundaries of the plurality of light-receiving elements are interposed in a column direction; and
a wiring layer provided on the second surface of the semiconductor substrate and electrically connected to the first semiconductor region.

(9)

The light-receiving element according to (8), wherein the second semiconductor regions are provided at positions adjacent to the first semiconductor regions in the column direction.

(10)

A solid-state imaging device including:
a semiconductor substrate;
a light-shielding film provided on a first surface of the semiconductor substrate and having a lattice form in which openings are arrayed in a matrix form;
a plurality of first semiconductor regions arrayed in a matrix form on a second surface opposite to the first surface of the semiconductor substrate;
a plurality of second semiconductor regions provided in an adjacent region which is the second surface of the semiconductor substrate and interposes each of the first semiconductor regions in a column direction;
a wiring layer provided on the second surface of the semiconductor substrate and electrically connected to the first semiconductor regions;
first reading circuits connected to the second semiconductor regions adjacent to the first semiconductor regions in a first direction among the plurality of second semiconductor regions; and
second reading circuits connected to the second semiconductor regions adjacent to the first semiconductor regions in a second direction opposite to the first direction among the plurality of second semiconductor regions, wherein
the first semiconductor region is located in a corresponding region with the light-shielding film and the first surface of the semiconductor substrate interposed therebetween, and
the wiring layer includes a main wiring extending in the column direction in the corresponding regions with the light-shielding film and the first surface of the semiconductor substrate interposed therebetween and a branch wiring extending in a row direction in the corresponding regions with the light-shielding film and the first surface of the semiconductor substrate interposed therebetween and connecting the main wiring to each of the first semiconductor regions.

(11)

A solid-state imaging device including:
a semiconductor substrate in which a plurality of light-receiving elements are arrayed in a matrix form;
light-shielding films provided on a first surface of the semiconductor substrate in a lattice form at boundaries of the plurality of light-receiving elements;
first semiconductor regions provided on a second surface opposite to the first surface of the semiconductor substrate in portions in which corners of four light-receiving elements gather among the plurality of light-receiving elements and four corners of a rectangular region formed by the four light-receiving elements;
second semiconductor regions provided on the second surface of the semiconductor substrate at positions at which boundaries extending in a row direction among boundaries of the plurality of light-receiving elements are interposed in a column direction;
a wiring layer provided on the second surface of the semiconductor substrate and electrically connected to the first semiconductor region;
first reading circuits connected to the second semiconductor regions adjacent to the first semiconductor regions in a first direction among the second semiconductor regions; and
second reading circuits connected to the second semiconductor regions adjacent to the first semiconductor regions in a second direction opposite to the first direction among the second semiconductor regions.

(12)

A ranging device including:
a light-emitting unit configured to emit light with a predetermined wavelength; a solid-state imaging device configured to generate a pixel signal from received light;
a calculation unit configured to calculate a distance to an object based on the pixel signal generated by the solid-state imaging device, wherein
the solid-state imaging device includes
a semiconductor substrate,
a light-shielding film provided on a first surface of the semiconductor substrate and having a lattice form in which openings are arrayed in a matrix form,
a plurality of first semiconductor regions arrayed in a matrix form on a second surface opposite to the first surface of the semiconductor substrate,
a plurality of second semiconductor regions provided in an adjacent region which is the second surface of the semiconductor substrate and interposes each of the first semiconductor regions in a column direction,
a wiring layer provided on the second surface of the semiconductor substrate and electrically connected to the first semiconductor regions, first reading circuits connected to the second semiconductor regions adjacent to the first semiconductor regions in a first direction among the plurality of second semiconductor regions, and
second reading circuits connected to the second semiconductor regions adjacent to the first semiconductor regions in a second direction opposite to the first direction among the plurality of second semiconductor regions, wherein
the first semiconductor region is located in a corresponding region with the light-shielding film and the first surface of the semiconductor substrate interposed therebetween, and
the wiring layer includes a main wiring extending in the column direction in the corresponding regions with the light-shielding film and the first surface of the semiconductor substrate interposed therebetween and a branch wiring extending in a row direction in the corresponding regions with the light-shielding film and the first surface of the semiconductor substrate interposed therebetween and connecting the main wiring to each of the first semiconductor regions.

(13)
A ranging device including:
a light-emitting unit configured to emit light with a predetermined wavelength;
a solid-state imaging device configured to generate a pixel signal from received light;
a calculation unit configured to calculate a distance to an object based on the pixel signal generated by the solid-state imaging device, wherein
the solid-state imaging device includes
a semiconductor substrate in which a plurality of light-receiving elements are arrayed in a matrix form,
light-shielding films provided on a first surface of the semiconductor substrate in a lattice form at boundaries of the plurality of light-receiving elements,
first semiconductor regions provided on a second surface opposite to the first surface of the semiconductor substrate in portions in which corners of four light-receiving elements gather among the plurality of light-receiving elements and four corners of a rectangular region formed by the four light-receiving elements,
second semiconductor regions provided on the second surface of the semiconductor substrate at positions at which boundaries extending in a row direction among boundaries of the plurality of light-receiving elements are interposed in a column direction,
a wiring layer provided on the second surface of the semiconductor substrate and electrically connected to the first semiconductor region,
first reading circuits connected to the second semiconductor regions adjacent to the first semiconductor regions in a first direction among the second semiconductor regions, and
second reading circuits connected to the second semiconductor regions adjacent to the first semiconductor regions in a second direction opposite to the first direction among the second semiconductor regions.

REFERENCE SIGNS LIST

1 ToF sensor
11 Control unit
13 Light-emitting unit
14 Light-receiving unit
15 Calculation unit
19 External I/F
20 Unit pixel
20A, 20B Reading circuit
21 p+ semiconductor region (MIX)
22, 22A, 22B n+ semiconductor region (DET)
23 Reset transistor
24 Transfer transistor
26 FD
27 Amplification transistor
28 Selection transistor
29A, 29B Constant current circuit
30, 230 PN semiconductor region
30A, 30B Signal extraction unit
31 Light-receiving element
40 Semiconductor substrate
41 Insulation film
42 Anti-reflection film
43 Flattened film
44 Light-shielding film
45 On-chip lens
50 Laminated chip
51 Light-receiving chip
52 Circuit chip
71, 72 Main wiring
73, 74 Branch wiring
80 Host
90 Object
100 Solid-state imaging device
101 Pixel array unit
102 System control unit
103 Vertical driving circuit
104 Column processing circuit
105 Horizontal driving circuit
106 Signal processing unit
107 Data storage unit
401 Groove
L1 Laser light
L2 Reflected light
L10 Incident light
LD Pixel driving line
VSL, VSL0, VSL1 Vertical signal line

The invention claimed is:
1. A light-receiving element, comprising:
a semiconductor substrate;
a light-shielding film on a first surface of the semiconductor substrate, wherein the light-shielding film has a lattice form in which openings are in a matrix form;
a plurality of first semiconductor regions arrayed in the matrix form on a second surface, wherein the second surface is opposite to the first surface of the semiconductor substrate;
a plurality of second semiconductor regions in an adjacent region of the second surface of the semiconductor substrate, wherein the plurality of second semiconductor regions corresponds to each of the plurality of first semiconductor regions in a column direction; and
a wiring layer on the second surface of the semiconductor substrate and electrically connected to the plurality of first semiconductor regions, wherein
the wiring layer includes:
a main wiring that extends in the column direction; and
a branch wiring that extends in a row direction and connects the main wiring to each of the plurality of first semiconductor regions.

2. The light-receiving element according to claim 1, wherein each of the plurality of first semiconductor regions is in a respective region that extends in the row direction in the light-shielding film.

3. The light-receiving element according to claim 1, wherein
the main wiring includes a first main wiring that extends in the column direction on a first side of a respective first semiconductor region of the plurality of first semiconductor regions in an odd column and a second main wiring that extends in the column direction on the first side of the respective first semiconductor region in an even column,
the plurality of first semiconductor regions includes a first set of semiconductor regions in odd rows and a second set of semiconductor regions in even rows, and
the first set of semiconductor regions is connected to the first main wirings via the branch wirings and the second set of semiconductor regions is connected to the second main wirings via the branch wirings.

4. The light-receiving element according to claim 1, wherein
the main wiring includes a first main wiring that extends in the column direction on a first side of a respective first semiconductor region of the plurality of first semiconductor regions in an odd column of a plurality of odd columns and a second main wiring that extends in the column direction on the first side of the respective first semiconductor region in an even column of a plurality of even columns,
the plurality of first semiconductor regions includes a first set of semiconductor regions in odd rows and a second set of semiconductor regions in even rows, and
in the plurality of odd columns, the first set of semiconductor regions is connected to the first main wirings via the branch wirings and the second set of semiconductor regions is connected to the second main wirings via the branch wirings, and
in the plurality of even columns, the first set of semiconductor regions are connected to the second main wirings via the branch wirings and the second set of semiconductor regions in the even rows are connected to the first main wirings via the branch wirings.

5. The light-receiving element according to claim 1, wherein a conductive type of each second semiconductor region of the plurality of second semiconductor regions is opposite to a conductive type of a respective first semiconductor region of the plurality of first semiconductor regions.

6. The light-receiving element according to claim 1, further comprising a plurality of on-chip lenses in the matrix form on the light-shielding film.

7. The light-receiving element according to claim 1, wherein the first surface of the semiconductor substrate has a moth-eye structure.

8. A light-receiving device, comprising:
a semiconductor substrate in which a plurality of light-receiving elements are in a matrix form;
light-shielding films on a first surface of the semiconductor substrate in a lattice form at boundaries of the plurality of light-receiving elements;
first semiconductor regions on a second surface that is opposite to the first surface of the semiconductor substrate, wherein the first semiconductor regions are in portions in which corners of four light-receiving elements gather among the plurality of light-receiving elements to form four corners of a rectangular region;
second semiconductor regions on the second surface of the semiconductor substrate at first positions at which specific boundaries that extend in a row direction among the boundaries of the plurality of light-receiving elements are in a column direction; and
a wiring layer on the second surface of the semiconductor substrate and electrically connected to each of the first semiconductor regions.

9. The light-receiving device according to claim 8, wherein the second semiconductor regions are at second positions adjacent to the first semiconductor regions in the column direction.

10. A solid-state imaging device, comprising:
a semiconductor substrate;
a light-shielding film on a first surface of the semiconductor substrate, wherein the light-shielding film has a lattice form in which openings are in a matrix form;
a plurality of first semiconductor regions in the matrix form on a second surface, wherein the second surface is opposite to the first surface of the semiconductor substrate;
a plurality of second semiconductor regions in an adjacent region of the second surface of the semiconductor substrate, wherein the plurality of second semiconductor regions corresponds to the plurality of first semiconductor regions in a column direction;
a wiring layer on the second surface of the semiconductor substrate and electrically connected to the plurality of first semiconductor regions;
first reading circuits connected to a first set of second semiconductor regions of the plurality of second semiconductor regions, wherein the first set of second semiconductor regions is adjacent to the plurality of first semiconductor regions in a first direction; and
second reading circuits connected to a second set of second semiconductor regions of the plurality of second semiconductor regions, wherein
the second set of second semiconductor regions is adjacent to the plurality of first semiconductor regions in a second direction opposite to the first direction,
the wiring layer includes:
a main wiring that extends in the column direction; and
a branch wiring that extends in a row direction and connects the main wiring to each of the plurality of first semiconductor regions.

11. A solid-state imaging device, comprising:
a semiconductor substrate in which a plurality of light-receiving elements are in a matrix form;
light-shielding films on a first surface of the semiconductor substrate in a lattice form at boundaries of the plurality of light-receiving elements;
first semiconductor regions on a second surface that is opposite to the first surface of the semiconductor substrate, wherein the first semiconductor regions are in portions in which corners of four light-receiving elements gather among the plurality of light-receiving elements to form four corners of a rectangular region;
second semiconductor regions on the second surface of the semiconductor substrate at positions at which specific boundaries that extend in a row direction among the boundaries of the plurality of light-receiving elements are in a column direction;

a wiring layer on the second surface of the semiconductor substrate and electrically connected to a respective first semiconductor region of the first semiconductor regions;

first reading circuits connected to a first set of second semiconductor regions of the second semiconductor regions, wherein the first set of second semiconductor regions is adjacent to the first semiconductor regions in a first direction; and second reading circuits connected to a second set of second semiconductor regions of the second semiconductor regions adjacent to the first semiconductor regions, wherein the second set of second semiconductor regions is in a second direction opposite to the first direction.

12. A ranging device, comprising:

a light-emitting unit configured to emit light with a specific wavelength;

a solid-state imaging device configured to generate a pixel signal from received light; and a calculation unit configured to calculate a distance to an object based on the pixel signal generated by the solid-state imaging device, wherein the solid-state imaging device includes:

a semiconductor substrate, a light-shielding film on a first surface of the semiconductor substrate, wherein the light-shielding film has a lattice form in which openings are in a matrix form, a plurality of first semiconductor regions in the matrix form on a second surface, wherein the second surface is opposite to the first surface of the semiconductor substrate, a plurality of second semiconductor regions in an adjacent region of the second surface of the semiconductor substrate, wherein the plurality of second semiconductor regions corresponds to the plurality of first semiconductor regions in a column direction, a wiring layer on the second surface of the semiconductor substrate and electrically connected to the plurality of first semiconductor regions, first reading circuits connected to a first set of second semiconductor regions of the plurality of second semiconductor regions adjacent to the plurality of first semiconductor regions in a first direction, and second reading circuits connected to a second set of second semiconductor regions of the plurality of second semiconductor regions, wherein the second set of second semiconductor regions is adjacent to the plurality of first semiconductor regions in a second direction opposite to the first direction, the wiring layer includes:

a main wiring that extends in the column direction; and a branch wiring that extends in a row direction and connects the main wiring to each of the plurality of first semiconductor regions.

13. A ranging device, comprising:

a light-emitting unit configured to emit light with a specific wavelength;

a solid-state imaging device configured to generate a pixel signal from received light; and a calculation unit configured to calculate a distance to an object based on the pixel signal generated by the solid-state imaging device, wherein the solid-state imaging device includes:

a semiconductor substrate that includes a plurality of light-receiving elements in a matrix form;

light-shielding films on a first surface of the semiconductor substrate in a lattice form at boundaries of the plurality of light-receiving elements;

a plurality of first semiconductor regions on a second surface that is opposite to the first surface of the semiconductor substrate, wherein the plurality of first semiconductor regions are in portions in which corners of four light-receiving elements gather among the plurality of light-receiving elements to form four corners of a rectangular region;

a plurality of second semiconductor regions on the second surface of the semiconductor substrate at positions at which specific boundaries that extend in a row direction among the boundaries of the plurality of light-receiving elements are in a column direction;

a wiring layer on the second surface of the semiconductor substrate and electrically connected to a respective first semiconductor region of the plurality of first semiconductor regions;

first reading circuits connected to a first set of second semiconductor regions of the plurality of second semiconductor regions, wherein the first set of second semiconductor regions is adjacent to the plurality of first semiconductor regions in a first direction; and second reading circuits connected to a second set of second semiconductor regions of the plurality of second semiconductor regions, wherein the second set of second semiconductor regions is adjacent to the plurality of first semiconductor regions in a second direction opposite to the first direction.

* * * * *